(12) United States Patent
Ma et al.

(10) Patent No.: US 11,858,844 B2
(45) Date of Patent: Jan. 2, 2024

(54) GLASS COMPOSITE, CASING, DISPLAY DEVICE AND TERMINAL DEVICE

(71) Applicant: BYD COMPANY LIMITED, Shenzhen (CN)

(72) Inventors: Lan Ma, Shenzhen (CN); Liang Chen, Shenzhen (CN); Xiong Yuan, Shenzhen (CN); Chen Li, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 17/265,189

(22) PCT Filed: Nov. 30, 2018

(86) PCT No.: PCT/CN2018/118769
§ 371 (c)(1),
(2) Date: Feb. 1, 2021

(87) PCT Pub. No.: WO2020/024497
PCT Pub. Date: Feb. 6, 2020

(65) Prior Publication Data
US 2021/0300001 A1 Sep. 30, 2021

(30) Foreign Application Priority Data
Aug. 2, 2018 (CN) .......................... 201810873440.6

(51) Int. Cl.
*B32B 17/06* (2006.01)
*B32B 7/023* (2019.01)
(Continued)

(52) U.S. Cl.
CPC ................ *C03C 27/06* (2013.01); *B08B 3/08* (2013.01); *B08B 7/0035* (2013.01); *B08B 11/04* (2013.01);
(Continued)

(58) Field of Classification Search
CPC ....... B32B 17/06; B32B 37/18; B32B 38/162; B32B 7/023; B32B 38/0008; B32B 3/26;
(Continued)

(56) References Cited

U.S. PATENT DOCUMENTS

2004/0106018 A1* 6/2004 Conzone ............... C03C 4/0071
428/704
2008/0032906 A1 2/2008 Verhaverbeke
(Continued)

FOREIGN PATENT DOCUMENTS

CN 1387690 A 12/2002
CN 200988819 Y 12/2007
(Continued)

OTHER PUBLICATIONS

NPL-1] Keda et al. (CN 105976712 A); Sep. 28, 2016 (EPO—machine translation to English). (Year: 2016).*
(Continued)

*Primary Examiner* — David Sample
*Assistant Examiner* — Donald M Flores, Jr.
(74) *Attorney, Agent, or Firm* — Wenye Tan

(57) ABSTRACT

A glass composite includes a first glass member and a second glass member. The first glass member and the second glass member are at least partially connected with each other at the surfaces. The glass composite has a light transmittance not lower than 95% of the light transmittance of the one, with the lower light transmittance, of the first glass member and the second glass member.

20 Claims, 11 Drawing Sheets

(51) Int. Cl.

| | |
|---|---|
| *B32B 37/18* | (2006.01) |
| *B32B 38/00* | (2006.01) |
| *B32B 38/16* | (2006.01) |
| *B32B 3/26* | (2006.01) |
| *B08B 11/04* | (2006.01) |
| *B08B 3/08* | (2006.01) |
| *B08B 7/00* | (2006.01) |
| *C03C 15/00* | (2006.01) |
| *C03C 23/00* | (2006.01) |
| *C03C 27/06* | (2006.01) |
| *C03C 17/00* | (2006.01) |
| *H05K 5/03* | (2006.01) |
| *H05K 5/00* | (2006.01) |

(52) U.S. Cl.
CPC ............. *B32B 3/26* (2013.01); *B32B 7/023* (2019.01); *B32B 17/06* (2013.01); *B32B 37/18* (2013.01); *B32B 38/0008* (2013.01); *B32B 38/162* (2013.01); *C03C 15/00* (2013.01); *C03C 17/002* (2013.01); *C03C 23/002* (2013.01); *C03C 23/006* (2013.01); *C03C 23/0075* (2013.01); *H05K 5/03* (2013.01); *B32B 2038/0052* (2013.01); *B32B 2307/40* (2013.01); *B32B 2307/42* (2013.01); *B32B 2310/0418* (2013.01); *B32B 2310/0831* (2013.01); *B32B 2310/14* (2013.01); *B32B 2315/08* (2013.01); *B32B 2457/20* (2013.01); *C03C 2217/73* (2013.01); *H05K 5/0017* (2013.01); *Y10T 428/19* (2015.01)

(58) Field of Classification Search
CPC ........ B32B 2310/14; B32B 2310/0831; B32B 2457/20; B32B 2315/08; B32B 2307/42; B32B 2038/0052; B32B 2310/0418; C03C 23/0075; C03C 23/006; C03C 27/06; C03C 23/002; C03C 15/00; Y10T 428/19; H05K 5/03
See application file for complete search history.

(56) References Cited

U.S. PATENT DOCUMENTS

2013/0327093 A1    12/2013   Kalkowski et al.
2017/0320294 A1*   11/2017   Yamamoto .............. B32B 17/06

FOREIGN PATENT DOCUMENTS

| CN | 105016632 A |   | 11/2015 |
|---|---|---|---|
| CN | 105976712 A | * | 9/2016 |
| CN | 105976712 A |   | 9/2016 |
| CN | 106132688 A |   | 11/2016 |
| CN | 106882931 A |   | 6/2017 |
| CN | 207072911 U |   | 3/2018 |
| CN | 107922233 A |   | 4/2018 |

OTHER PUBLICATIONS

The World Intellectual Property Organization (WIPO) International Search Report for PCT/CN2018/118769 dated May 6, 2019 7 Pages.

\* cited by examiner

GLASS COMPOSITE, CASING, DISPLAY DEVICE AND TERMINAL DEVICE

CROSS-REFERENCE TO RELATED APPLICATIONS

This application is a national phase entry under 35 U.S.C. § 371 of International Application No. PCT/CN2018/118769, filed on Nov. 30, 2018, which claims priority to Chinese Patent Application No 201810873440.6 filed by the BYD Co., Ltd. on Aug. 2, 2018, and entitled GLASS COMPOSITE, HOUSING, DISPLAY APPARATUS AND TERMINAL DEVICE, the entire content of all of which is incorporated herein by reference in its entirety.

FIELD

The present disclosure relates to the technical field of electronic devices, and in particular, to a glass composite, a casing, a display device, and a terminal device.

BACKGROUND

Glass, due to its brittleness, is difficult to be processed, particularly when being processed into some complex and fine shapes and structures. At present, in order to expand the scope of application of glass and meet the requirements of use in certain specific fields, multiple glass members can be compounded to form a glass composite for use. As such, the obtained composite can have the properties of glass and attain complex and fine shapes. However, the glass composite currently obtained has the problem of deformation of glass during processing, which greatly affects the appearance quality and optical performance of the glass composite. Moreover, uneven deformation can cause serious surface distortion and unevenness, which limits the use of glass composite.

Accordingly, glass composite-related technologies still need improvement.

SUMMARY

The present disclosure aims to solve one of the technical problems in related art at least to some extent. In this regard, an objective of the present disclosure is to provide a glass composite with high light transmittance, good optical performance, almost no bubbles or fantasy colors, relatively flat surface, almost no scratches, and better performance during use.

One aspect of present disclosure provides a glass composite. According to an embodiment of the present disclosure, the glass composite includes a first glass member and a second glass member, wherein the first glass member and the second glass member are partially connected with each other at the surfaces, the glass composite has a light transmittance (indicating the ability of light to penetrate through a medium, and expressed as the percentage of flux of light penetrating through the medium relative to the flux of incident light) not lower than 95% of the light transmittance of the one, with the lower light transmittance, of the first glass member and the second glass member. Therefore, the glass composite has high light transmittance, good optical performance, and almost no bubbles or fantasy colors; and the bonding strength between the first glass member and the second glass member is high to attain a special-shaped structure.

Another aspect of present disclosure provides a casing. According to an embodiment of the present disclosure, at least a part of the casing is formed by the glass composite described above. Therefore, the casing has high light transmittance, good optical performance, and almost no bubbles or fantasy colors, and can attain a special-shaped structure, meet the requirements of use in different situations, and have a wide scope of application.

Another aspect of present disclosure provides a display device. According to an embodiment of the present disclosure, the display device includes the glass composite or the casing as described above. Therefore, the display device has aesthetic appearance, high light transmittance, and good display effect.

Further aspect of present disclosure provides a terminal device. According to an embodiment of the present disclosure, the terminal device includes the glass composite, the casing or the display device described above. The present inventors find that the terminal device is aesthetically pleasant, has high strength, can achieve an all-glass appearance, and has good performance.

DETAILED DESCRIPTION

Figure 1:
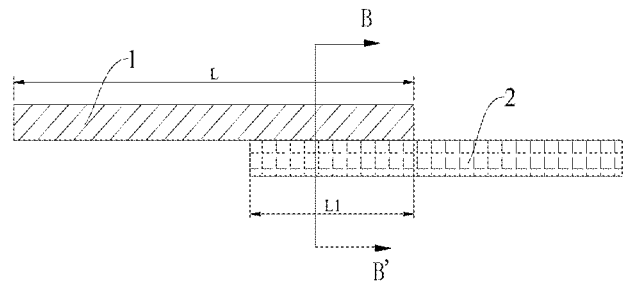
FIG. 1 is a schematic cross-sectional structural view of a glass composite according to an embodiment of the present disclosure.

Embodiments of the present disclosure will be described in detail below. The embodiments described below are exemplary, and are only intended to explain the present disclosure rather than being construed as limitation to the present disclosure. Where specific techniques or conditions are not indicated in the examples, the procedures shall be carried out in accordance with the techniques or conditions described in the literatures in the field or in accordance with the product specification. The reagents or instruments for which no manufacturers are noted are all common products commercially available from the market.

One aspect of present disclosure provides a glass composite. According to an embodiment of the present disclosure, referring to FIG. 1, the glass composite includes a first glass member 1 and a second glass member 2 which are partially connected with each other at the surfaces. The glass composite has a light transmittance no lower than 95% of the light transmittance of the one, with the lower light transmittance, of the first glass member and the second glass member. For example, the glass composite has a light transmittance not lower than 95%, 96%, 97%, 98%, 99%, or 100% of the light transmittance of the one, with the lower light transmittance, of the first glass member and the second glass member. Specifically, if the light transmittance of the first glass member is greater than the light transmittance of the second glass member, then the light transmittance of the glass composite is not less than 95% of the light transmittance of the second glass member. If the light transmittance of the first glass member is lower than the light transmittance of the second glass member, then the light transmittance of the glass composite is not less than 95% of the light transmittance of the first glass member. Therefore, the glass composite has high light transmittance, good optical performance, and almost no bubbles or fantasy colors; and by means of the connection between the first glass member and the second glass member, various complex and fine shapes and structures can be attained, including, for example, but not limited to, a special-shaped structure and a six-sided-ring enveloped structure.

It should be noted that the light transmittance of a glass member is often related to the thickness of the glass member. When the difference in thickness is not large and the thickness has no obvious influence on the light transmittance, with reference to "the glass composite has a light transmittance not lower than 95% of the light transmittance of the one, with the lower light transmittance, of the first glass member and the second glass member" as described herein, the influence of thickness on the glass and the glass composite can be ignored. For example, this can be that the light transmittance at the bonding position of the first glass member and the second glass member in the glass composite is not lower than 95% of the light transmittance of the one, with the lower light transmittance, of the first glass member and the second glass member. If the thickness of the first glass member or the second glass member is large and the thickness has an obvious influence on the light transmittance, "the glass composite has a light transmittance not lower than 95% of the light transmittance of the one, with the lower light transmittance, of the first glass member and the second glass member" as described herein may be that the light transmittance at the bonding position of the first glass member and the second glass member in the glass composite is not lower than 95% of the light transmittance of the same glass member having the same or close thickness at the bonding position and with the lower light transmittance, of the first glass member and the second glass member.

According to an embodiment of the present disclosure, the material of the first glass member or the second glass member includes, but is not limited to, aluminosilicate (such as Corning glass, etc.), borosilicate (such as Schott glass, etc.), cover glass (including high-alumina high-alkali aluminosilicate glass and soda-lime silica glass, etc.), touch screen substrate glass (such as alkali and heavy metal (arsenic, antimony, and barium)-free alkaline earth sodium pyroborate-aluminosilicate glass, soda glass and neutral borosilicate glass), and TFT display screen substrate glass (including but not limited to Corning Eagle XG, Eagle XG Silm, Willow and other brands of alkali and heavy metal (arsenic, antimony, and barium)-free alkaline earth sodium pyroborate-aluminosilicate glass). Flexible selections can be made by those skilled in the art according to actual needs, as long as the requirements can be met.

According to an embodiment of the present disclosure, the specific structure and shape of the glass composite are not particularly limited, and may be a sheet structure, various complex 2.5-dimensional structures, or 3-dimensional structures. According to an embodiment of the present disclosure, the contact surfaces of the first glass member and the second glass member can be a flat surface, a curved surface, or a combination of a flat surface and a curved surface, as long as the two can be brought into contact with each other without clearance. For example, if the activated surface of the first glass member is an upwardly bulged curved surface, then the activated surface of the second glass member is correspondingly an upwardly depressed curved surface. The specific shape and structure can be flexibly selected by those skilled in the art according to actual needs. In this way, the requirements of use in different situations can be met, so as to expand the scope of application of glass members.

Figure 6A:
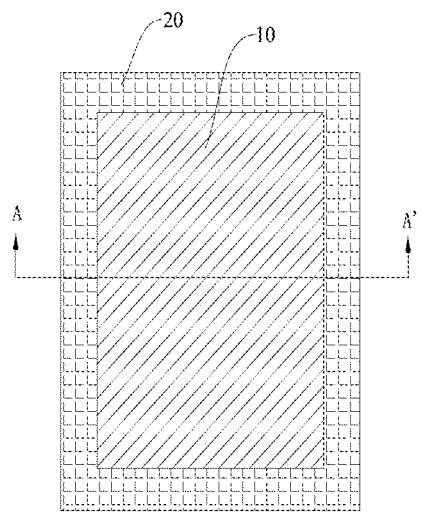
FIG. 6A is a top view of a casing according to an embodiment of the present disclosure.
Figure 6B:
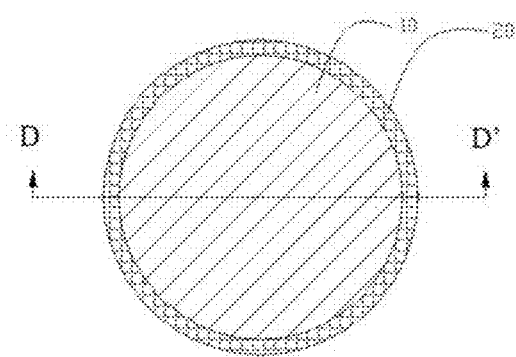
FIG. 6B is a top view of the casing according to another embodiment of the present disclosure.
Figure 6C:
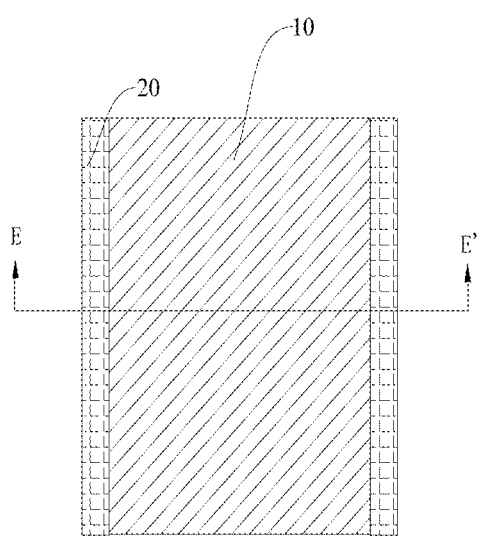
FIG. 6C is a top view of the casing according to another embodiment of the present disclosure.
Figure 7A:
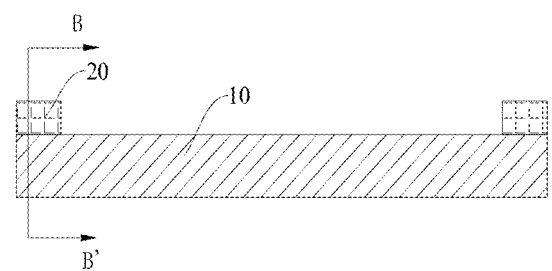
FIG. 7A is a schematic cross-sectional structural view taken along the line A-A' in FIG. 6A, along the line D-D' in FIG. 6B, or along the line E-E' in FIG. 6C.
Figure 7B:
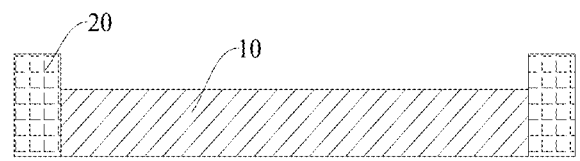
FIG. 7B is a schematic cross-sectional structural view taken along the line A-A' in FIG. 6A, along the line D-D' in FIG. 6B, or along the line E-E' in FIG. 6C.

According to some embodiments of the present disclosure, referring to FIGS. 6 and 7, the first glass member in the glass composite is a sheet glass member 10, and the second glass member in the glass composite is a frame-shaped glass member 20. The frame-shaped glass member 20 is connected to the outer peripheral edge of the sheet glass member 10. Further, referring to FIG. 8, the outer surfaces 30 at the position where the sheet glass member 10 and the frame-shaped glass member 20 are connected are a curved surface. According to other embodiments of the present disclosure, referring to FIG. 10, the first glass member in the glass composite is a first sheet glass member 11 and the second glass member is a second sheet glass member 21. The shape of the second sheet glass member 21 includes rectangle, square, circle (see FIG. 9 for the schematic structure), polygons or irregular shapes. Specifically, the surfaces of the first sheet glass member 11 and the second sheet glass member 21 may be partially in contact, or part of the surface of the first sheet glass member 11 is in contact with a whole surface of the second sheet glass member 21 (see FIGS. 10 and 11 for the schematic structure). Of course, it is to be understood by those skilled in the art that in addition to the cases shown in FIGS. 8, 10 and 11, other shapes and modes of connection are also contemplated in the scope of protection of the present disclosure.

Figure 10:
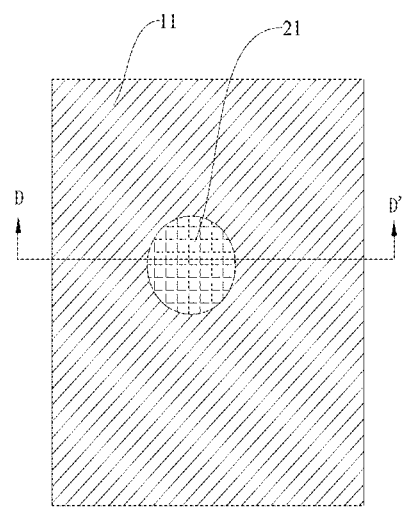
FIG. 10 is a schematic planar structural view of the casing according to another embodiment of the present disclosure.
Figure 11:
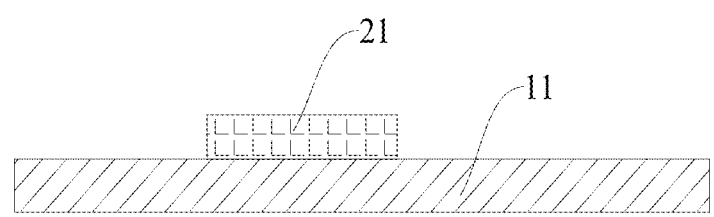
FIG. 11 is a schematic cross-sectional structural view taken along the line D-D' in FIG. 10.

According to an embodiment of the present disclosure, referring to FIGS. 10 and 11, the surface with a larger area of the first sheet glass member 11 is connected to the surface with a larger area of the second sheet glass member 21.

Figure 12:
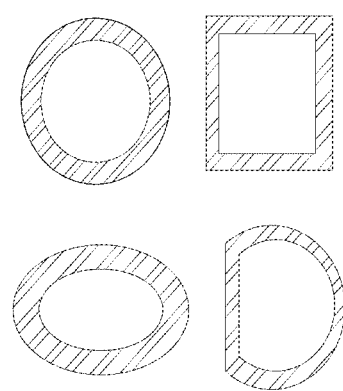
FIG. 12 illustrates a schematic planar structural view of a first frame-shaped glass member and a second frame-shaped glass member according to an embodiment of the present disclosure.
Figure 13:
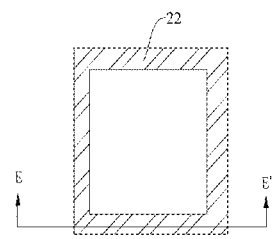
FIG. 13 is a schematic structural view of the casing according to another embodiment of the present disclosure, where the upper panel is a schematic planar structural view, and the lower panel is a schematic cross-sectional structural view along the line E-E' in the upper panel.
Figure 13:
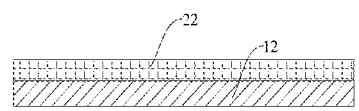
Figure 14:
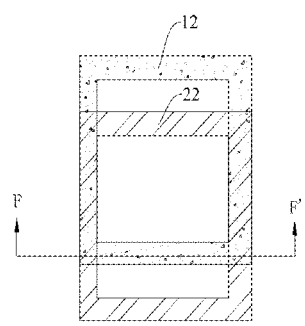
FIG. 14 is a schematic structural view of the casing according to another embodiment of the present disclosure, where the upper panel is a schematic planar structural view, and the lower panel is a schematic cross-sectional structural view along the line F-F' in the upper panel.
Figure 14:
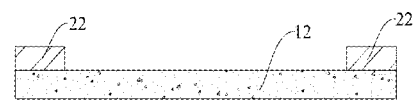
Figure 15:
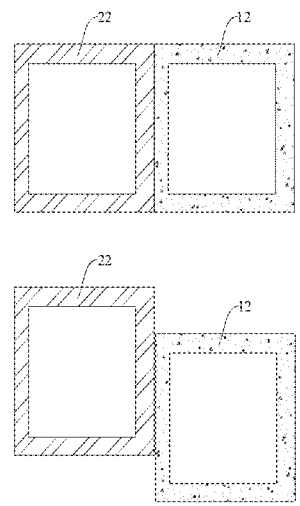
FIG. 15 is a schematic planar structural view of the casing according to another embodiment of the present disclosure.

According to some embodiments of the present disclosure, referring to FIGS. 12-15, the first glass member in the glass composite is a first frame-shaped glass member 12 and the second glass member is a second frame-shaped glass member 21. Specifically, the shapes of the first frame-shaped glass member and the second frame-shaped glass member are not particularly limited. Referring to FIG. 12, they can be a circle, a box, a curved frame, or a frame having straight and curved lines in combination. The position of connection of the first frame-shaped glass member and the second frame-shaped glass member is also not particularly limited. They can be laminated and connected vertically (see FIGS. 13 and 14 for the schematic structure), or connected horizontally side by side (see FIG. 15 for the schematic structure), and have an aligned arrangement (see FIG. 13 and the upper panel of FIG. 15 for the schematic structure), or staggered arrangement (see the lower panels of FIGS. 14 and 15 for the schematic structure).

Of course, those skilled in the art can understand that the shape and structure of the glass composite described above are only illustrative and should not be construed as limiting the present disclosure. The specific shape and structure of the glass composite can be flexibly selected according to the requirements in practical application.

According to an embodiment of the present disclosure, at least one of the first glass member and the second glass member is formed by a plurality of sub-glass members, and at least part of the surfaces of two adjacent sub-glass members are connected. Therefore, a glass composite formed by connecting three, four or more glass members can be achieved, which makes it easier to form complex and fine structures and shapes, thus expanding the scope of application of glass.

According to an embodiment of the present disclosure, the material forming the sub-glass member may be the same as the material forming the first glass member or the second glass member described above, and the two adjacent sub-glass members are connected in the same mode as does between the first glass member and the second glass member. That is, the light transmittance of the first glass member or the second glass member formed by a plurality of the sub-glass members is not lower than 95% of the light transmittance of the sub-glass member. As a result, a complex and fine special-shaped structure is achieved. The light transmittance of the glass composite is substantially not affected, and the optical performance is better. It is applicable to an electronic device, and even an all-glass appearance of an electronic device can be realized therewith.

Figure 2:
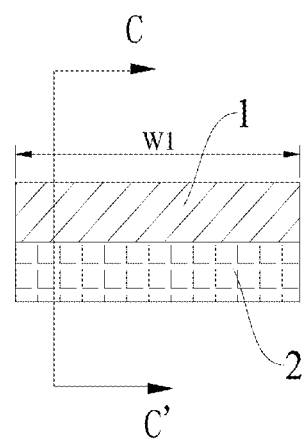
FIG. 2 is a schematic cross-sectional structural view taken along the line B-B' in FIG. 1.
Figure 3:
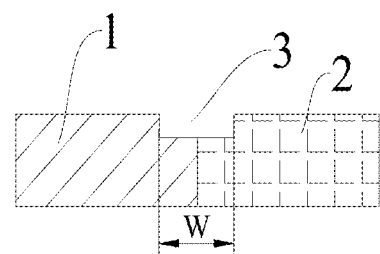
FIG. 3 is a schematic cross-sectional structural view taken along the line C-C' in FIG. 2.

According to an embodiment of the present disclosure, the number of sub-glass members is not particularly limited, and can be flexibly selected by those skilled in the art according to actual needs as long as the requirements can be met, According to an embodiment of the present disclosure, under the same conditions, the rate of corrosion by hydrofluoric acid at the interface where the first glass member and the second glass member are connected is greater than the rate of corrosion of the first glass member and the second glass member by hydrofluoric acid. Thus, the existence of the bonding interface can be effectively detected. In some embodiments of the present disclosure, referring to FIG. 1, FIG. 2 and FIG. 3, the first glass member and the second glass member are connected to form a contact interface, a cross section along the direction perpendicular to the contact interface is defined as the first cross section (see FIG. 2 for the schematic structure). After the first cross section is brought into contact with hydrofluoric acid, a crevice 3 appears in the contact interface (see FIG. 3 for the schematic structure, where the crevice shape shown in FIG. 3 is merely illustrative, and should not be construed as limiting the present disclosure; and it can be understood by those skilled in the art that the specific crevice shape can be various geometric shapes or irregular random shapes depending on the etching process with hydrofluoric acid). Specifically, the first cross section is obtained after cutting the glass composite (for ease of observation, the first cross section obtained after cutting is polished to remove the burrs, to achieve a better observation effect) and there is no crevice when observed visually by naked eyes or under a microscope at a magnification of 500×. After the first cross section is corroded in a hydrofluoric acid solution having a mass concentration of 5%-40% for 30 s-1200 s (for example, 30 s, 1 min, 5 min, 10 min, 15 min, and 20 min), the compounding interface of the first glass member and the second glass member is corroded to form a crevice having a width W of 0.1-300 μm, for example, 0.1 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 105 μm, 110 μm, 115 μm, 120 μm, 125 μm, 130 μm, 135 μm, 140 μm, 145 μm, 150 μm, 155 μm, 160 μm, 165 μm, 170 μm, 175 μm, 180 μm, 185 μm, 190 μm, 195 μm, 200 μm, 205 μm, 210 μm, 215 μm, 220 μm, 225 μm, 230 μm, 235 μm, 240 μm, 245 μm, 250 μm, 255 μm, 260 μm, 265 μm, 270 μm, 275 μm, 280 μm, 285 μm, 290 μm, 295 μm, and 300 μm.

In some specific embodiments of the present disclosure, after the first cross section described herein is brought into contact with hydrofluoric acid having a mass concentration of 5%, 10%, 20% and 40% for 300 s respectively, the width of the crevice is respectively 0.1-30 μm (for example, 0.1 μm, 1 μm, 5 μm, 10 μm, 15 μm, 20 μm, 25 μm, and 30 μm), 0.5-50 μm (for example, 0.5 μm, 1 μm, 5 μm, 10 μm, 15 μm, 20 μm, 25 μm, 30 μm, 35 μm, 40 μm, 45 μm, and 50 μm), 0.5-100 μm (for example, 0.5 μm, 1 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, and 100 μm), and 2-100 μm (for example, 2 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, and 100 μm). After the first cross section is brought into contact with hydrofluoric acid having a mass concentration of 5%, 10%, 20%, and 40% for 600 s respectively, the width of the crevice is respectively 1-50 μm (for example, 1 μm, 5 μm, 10 μm, 15 μm, 20 μm, 25 μm, 30 μm, 35 μm, 40 μm, 45 μm, and 50 μm), 1-80 μm (for example, 1 μm, 5 μm, 10 μm, 15 μm, 20 μm, 25 μm, 30 μm, 35 μm, 40 µm, 45 µm, 50 µm, 55 µm, 60 µm, 65 µm, 70 µm, 75 µm, 80 µm, and 85 µm), 3-120 µm (for example, 3 µm, 5 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 105 µm, 110 µm, 115 µm, and 120 µm) and 5-120 µm (for example, 5 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 105 µm, 110 µm, 115 µm, and 120 µm).

It should be noted that in the embodiments of present disclosure, the width of the crevice given depends on the specific glass material, experimental conditions and test conditions used by the inventor, and the width varies with different glass materials, experimental conditions or test conditions.

According to an embodiment of the present disclosure, in order to further improve the light transmittance of the glass composite to meet the requirements of use in the display field (such as the display screen), at least one surface of the first glass member or the second glass member can be provided with an anti-reflection (AR) film, to further improve the light transmittance of the glass composite and enable the glass composite to achieve a light transmittance comparable to or higher than that of the first glass member or the second glass member.

According to an embodiment of the present disclosure, the glass composite can be used in a protective cover plate or casing for an electronic product, as well as in a casing of a wearable device or in automotive glass.

Figure 4:
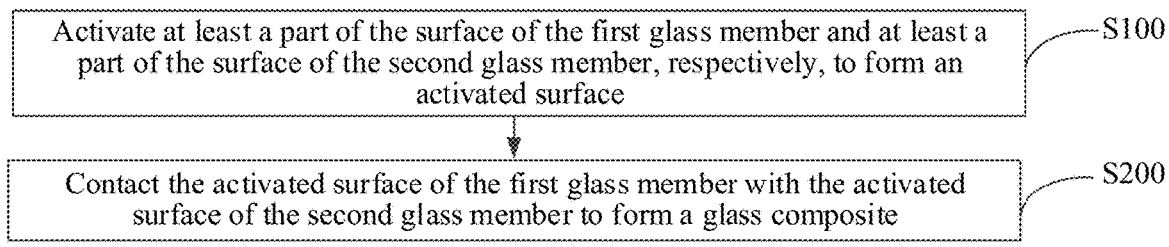
FIG. 4 is a schematic flow chart of a method for producing the glass composite according to an embodiment of the present disclosure.

According to an embodiment of the present disclosure, referring to FIG. 4, the glass composite can be prepared through a process comprising the following steps:

S100: Activate at least a part of the surface of the first glass member and at least a part of the surface of the second glass member, respectively, to form an activated surface.

Figure 5:
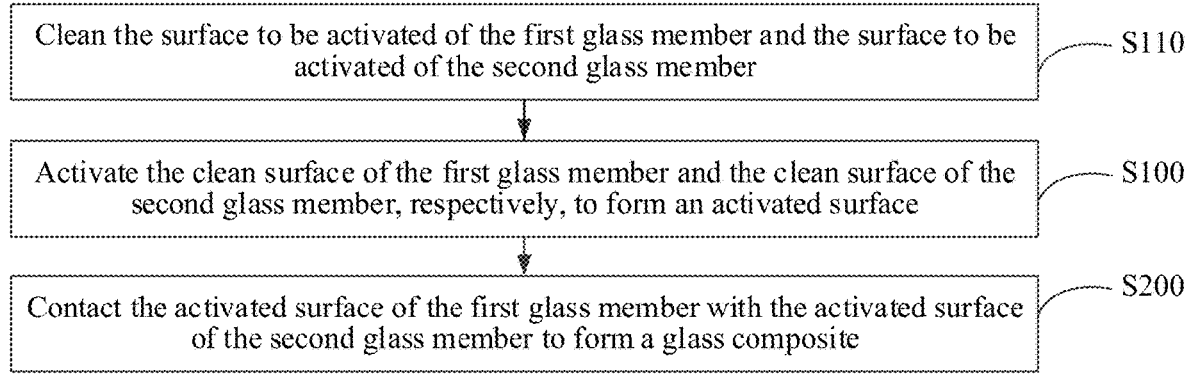
FIG. 5 is a schematic flow chart of a method for producing the glass composite according to another embodiment of the present disclosure.

According to an embodiment of the present disclosure, referring to FIG. 5, the method further includes before the activation treatment:

S110: Clean the surface to be activated of the first glass member and the surface to be activated of the second glass member. In some embodiments of the present disclosure, the cleaning may include: washing the glass member with an acid detergent (such as hydrofluoric acid, sulfuric acid or peroxyacetic acid), an alkaline detergent (such as sodium carbonate or calcium hypochlorite), an organic reagent (such as acetone, or trichloroethylene) or plasma; and drying in some embodiments of the present disclosure. In some embodiments of the present disclosure, the glass member can be washed with trichloroethylene. This is beneficial to remove the oil stain on the surfaces of the glass members, to facilitate the progression of subsequent steps.

According to an embodiment of the present disclosure, the activation can suitably produce unsaturated chemical bonds on the surface of the first glass member and the surface of the second glass member. Therefore, after the activation, unsaturated chemical bonds with higher energy are generated on the surface of the first glass member or the second glass member, so when the two are infinitely close to each other, the unsaturated chemical bonds on the surfaces of the glass members are bonded to each other to form a stable saturated chemical bond. The inner unity of the glass composite obtained is high, and the bonding force between the first glass member and the second glass member is strong, whereby the final glass composite has an almost unaffected light transmittance and good performance.

It should be noted that the phrase "unsaturated chemical bond" used herein refers to a chemical bond that contains an unpaired electron or lone pair of electrons, and generally has a high energy and cannot exist stably. For example, it can be a metal atom linked with an oxygen atom having a lone pair of electrons contained in the glass member, where the metal atom can specifically be any metal atom contained in the glass, including, for example, but not limited to aluminum-oxygen unsaturated bond, sodium-oxygen unsaturated bond, potassium-oxygen unsaturated bond, and calcium-oxygen unsaturated bond. It can also be a non-metallic atom linked with an oxygen atom having a lone pair of electrons in the glass member. The non-metallic atom can specifically be any non-metallic atom in the glass member, including, for example, but not limited to, silicon-oxygen unsaturated bond, and boron-oxygen unsaturated bond. It can also be a metal atom or non-metal atom having an unpaired electron or empty orbital (easy to bond with a lone pair of electrons), for example, aluminum, sodium, potassium, or calcium that contains an unpaired electron or has an empty orbital; or it can also be a silicon dangling bond, or an oxygen dangling bond. "Saturated chemical bond" refers to a chemical bond that does not contain an unpaired electron, generally has a low energy, and can exist stably. Specifically, it can be a chemical bond formed after the above-mentioned unsaturated bond is bonded, including, but not limited to, silicon-oxygen-silicon bond and the like.

According to an embodiment of the present disclosure, the activation is carried out by at least one of: a. treatment with an activation solution that is acidic or basic; b. plasma treatment; and c. UV treatment. For example, it is possible to adopt treatment with an activation solution, plasma treatment or UV treatment alone, treatment with an activation solution and plasma treatment in combination, plasma treatment and UV treatment in combination, treatment with an activation solution and UV treatment in combination, or treatment with an activation solution, plasma treatment and UV treatment in combination. Therefore, the operation is simple, convenient, and easy to implement, an activated surface can be efficiently formed on the surfaces of the first glass member and the second glass member, the activation effect is better, and the bonding force between the first glass member and the second glass member can be significantly improved.

According to an embodiment of the present disclosure, wherein the treatment with an activation solution comprising the specific method of activation includes, but is not limited to, dropping the activation solution onto the surfaces to be activated of the first glass member and the second glass member, or immersing the first glass member and the second glass member in the activation solution. The plasma treatment includes: the first glass member and the second glass member are positioned in a plasma treatment device, and then the surfaces of the first glass member and the second glass member are activated by plasma generated by an inert gas (for example, one of nitrogen, argon, and helium, or a mixture thereof), a hydrogen-containing gas or an oxygen-containing gas under the action of electrical discharge, high-frequency electromagnetic oscillation, shock wave, and high-energy radiation. The UV treatment includes: the first glass member and second glass member can be directly irradiated with ultraviolet light, or the first glass member and the second glass member can be irradiated with ultraviolet light in the presence of ozone, whereby ozone can provide highly active atomic oxygen to form a volatile substance with free radicals generated after the dissociation of the dirt and thus enable an activated surface.

According to an embodiment of the present disclosure, the activation solution contains: an acid (including, for example, but not limited to, at least one of sulfuric acid, hydrochloric acid, hydrogen fluoride, ammonium bifluoride, nitric acid, and acetic acid) or a alkali (including, for example, but not limited to, at least one of sodium carbonate, sodium bicarbonate, potassium hydroxide, sodium hydroxide and aqueous ammonia); and an auxiliary agent, including at least one of an oxidizing agent (for example, at least one of potassium dichromate, hydrofluoric acid, hydrochloric acid and hydrogen peroxide), an alcohol (including, for example, but not limited to, ethanol and methanol), an organic acid (including, for example, but not limited to, acetic acid), a carbohydrate (including, for example, but not limited to, glucose), an amino acid, and a surfactant (including, for example, but not limited to, sodium dodecyl sulfonate). Therefore, the activation solution can create a better acidic or basic environment, with which unsaturated chemical bonds with higher energy can be formed on the surfaces of the glass members, which is beneficial to the subsequent steps.

According to an embodiment of the present disclosure, the activation solution is acidic or basic. Therefore, the activation operation is simple and convenient, and can be accomplished easily, and the activation effect is better. According to an embodiment of the present disclosure, when the activation solution is acidic, the activation solution further includes an oxidizing agent (such as potassium dichromate, potassium permanganate, nitric acid, and hydrogen peroxide, etc.), to improve the activation ability of the activation solution, so as to form unsaturated chemical bonds on the surface of the glass member easily.

According to an embodiment of the present disclosure, the pH of the activation solution is not greater than 4 (such as 1, 2.5, 3, 3.5, and 4, etc.), or the pH of the activation solution is 10-14 (such as 10, 10.5, 11, 11.5, 12, 12.5, 13, 13.5, and 14 etc.). When the pH of the activation solution is within the above range, more unsaturated chemical bonds can be formed, which is beneficial to the compounding between the first glass member and the second glass member. If the activation solution is excessively highly acidic or basic, the surface roughness of the glass member is affected, making the light transmittance of the glass composite relatively low; and if the activation solution is excessively lowly acidic or basic, the activation effect on the surface of the glass member is poor, and few unsaturated chemical bonds are obtained.

In some embodiments of the present disclosure, the raw materials for forming the activation solution include hydrogen peroxide and sulfuric acid. In this manner, the activation effect of the activation solution is better, and more unsaturated chemical bonds are obtained, which is more conducive to the compounding between the first glass member and the second glass member; and the glass composite thus obtained has almost no bubbles or fantasy colors. In some specific embodiments of the present disclosure, the activation solution is a mixture of hydrogen peroxide and sulfuric acid in a volume ratio of (1:3) to (3:7) (such as 1:3, 1:2.8, 1:2.6, 1:2.5, and 1:2.3). As such, the activation solution is relatively highly acidic or oxidative, which promotes the activation of the surface of the glass member to generate more unsaturated chemical bonds, so a better activation effect is achieved. Compared with other ranges of mixing ratio, when the volume ratio of hydrogen peroxide and sulfuric acid is within the above range, the activation effect is better, the light transmittance of the obtained glass composite is higher, and the fantasy color is less.

In some other embodiments of the present disclosure, the raw materials for forming the activation solution include potassium dichromate and sulfuric acid, including, for example, but not limited to, a mixture of potassium dichromate and sulfuric acid in a weight ratio of (1-3):4 (such as 1:4, 1.5:4, 2:4, 2.5:4, and 3:4). In some embodiments of the present disclosure, the raw materials for forming the activation solution include hydrofluoric acid and ammonium bifluoride, for example, a mixed solution of hydrofluoric acid and ammonium bifluoride having a mass concentration of 5%-40% (such as 5%, 10%, 15%, 20, 25%, 30%, 35%, and 40%). As a result, the surface activation of the glass member is promoted to generate more unsaturated chemical bonds, and the activation effect is better.

In some embodiments of the present disclosure, the raw materials for forming the activation solution include aqueous ammonia and hydrogen peroxide. In some specific embodiments of the present disclosure, the activation solution is a mixed solution of aqueous ammonia and hydrogen peroxide in a volume ratio of (1:1)-(1:5) (for example, 1:1, 1:2, 1:3, 1:4, and 1:5). As such, the activation solution is relatively highly oxidative, which promotes the activation of the surface of the glass member to generate more unsaturated chemical bonds, so a better activation effect is achieved.

According to an embodiment of the present disclosure, the raw materials for forming the basic activation solution include sodium hypochlorite and aqueous ammonia. In some embodiments of the present disclosure, the basic activation solution includes a mixture of 5-20 wt % of sodium hypochlorite, 5-30 wt % of aqueous ammonia, and 50-90 wt % of deionized water, in which the content of sodium hypochlorite can be 5 wt %, 10 wt %, 15 wt % or 20 wt %, the content of aqueous ammonia can be 5 wt %, 10 wt %, 15 wt %, 20 wt %, 25 wt % or 30 wt %, and the content of deionized water can be 50 wt %, 55 wt %, 60 wt %, 65 wt %, 70 wt %, 75 wt %, 80 wt % or 90 wt %. As a result, the activation solution allows more unsaturated chemical bonds to be exposed on the surface of the glass member, and the activation effect is better. According to an embodiment of the present disclosure, the UV treatment includes UV irradiation of the surfaces of the first glass member and the second glass member for 0.5-15 h (for example, 0.5 h, 0.6 h, 0.7 h, 0.8 h, 0.9 h, 1.0 h, 1.1 h, 1.2 h, 1.3 h, 1.4 h, 1.5 h, 2 h, 3 h, 4 h, 5 h, 6 h, 7 h, 8 h, 9 h, 10 h, 11 h, 12 h, 13 h, 14 h, and 15 h); or UV irradiation, in the presence of ozone, of the surfaces of the first glass member and the second glass member for 5-20 min (for example, 5 min, 6 min, 7 min, 8 min, 9 min, 10 min, 11 min, 12 min, 13 min, 14 min, 15 min, 16 min, 17 min, 18 min, 19 min, and 20 min). In this manner, more unsaturated chemical bonds are generated and exposed on the surface of the glass member, and the activation effect is better.

According to an embodiment of the present disclosure, the plasma treatment includes treating the surfaces of the first glass member and the second glass member for 10-30 min (such as 10 min, 11 min, 12 min, 13 min, 14 min, 15 min, 16 min, 17 min, 18 min, 19 min, 20 min, 21 min, 22 min, 23 min, 4 min, 25 min, 26 min, 27 min, 28 min, 29 min or 30 min) by at least one of $O_2$ plasma and $N_2/H_2$ plasma at an excitation frequency of 10 MHz-15 MHz (such as 10.25 MHz, 10.5 MHz, 11 MHz, 11.25 MHz, 11.5 MHz, 11.75 MHz, 12 MHz, 13 MHz, 13.8 MHz, 14 MHz, 14.5 MHz, and 15 MHz). As a result, more unsaturated chemical bonds are generated and exposed on the surface of the glass member, and the activation effect is better.

It should be noted that the phrase "$N_2/H_2$ plasma" used herein refers to a mixed plasma of $N_2$ and $H_2$. Specifically, the activation can be performed by $O_2$ plasma alone, $N_2/H_2$ plasma alone, or $O_2$ plasma and $N_2/H_2$ plasma in combination.

According to an embodiment of the present disclosure, the activation is carried out at room temperature to 200° C. For example, the activation can take place at 25° C., 40° C., 50° C., 60° C., 70° C., 80° C., 90° C., 100° C., 110° C., 130° C., 150° C., 170° C., 190° C., or 200° C. In this way, the activation in the above temperature range is more conducive to the formation of more unsaturated chemical bonds, and the activation effect is better. Compared with the above temperature range, if the activation temperature is too high, the activation solution is easier to volatilize, so the service life is short, and the activation effect is poor; and if the activation temperature is too low, the activation effect of the glass is poor.

According to an embodiment of the present disclosure, since the unsaturated chemical bonds formed after the activation are extremely active and prone to reaction with oxygen in the air, and thus have a short residence time, the first glass member and the second glass member are positioned in a vacuum environment in a period of time from the completion of the activation to the completion of the contact. As a result, the unsaturated chemical bonds formed after the activation will not contact and react with oxygen in the air, thus extending the residence time of the unsaturated chemical bonds. This is beneficial to the subsequent steps, and improves the bonding strength between the first glass member and the second glass member. In some embodiments of the present disclosure, the activation can be directly performed in a vacuum environment, or the first glass member and the second glass member can also be positioned in a vacuum environment after the activation, until the contact is completed. Therefore, the activity of unsaturated chemical bonds are maintained as much as possible, thereby significantly improving the bonding strength between the first glass member and the second glass member.

According to an embodiment of the present disclosure, the activated surface obtained after the activation has a smaller water contact angle, for example, not more than 10 degrees, such as 1 degree, 2 degrees, 3 degrees, 4 degrees, 5 degrees, 6 degrees, 7 degrees, 8 degrees, 9 degrees, or 10 degrees, etc. This shows that the activated surface is formed with more unsaturated chemical bonds having higher energy, which facilitates the improvement of the bonding between the first glass member and the second glass member. According to an embodiment of the present disclosure, the surface roughness (RA) of the first glass member and the second glass member is not greater than 0.2 µm, such as 0.2 µm, 0.18 µm, 0.16 µm, 0.15 µm, 0.12 µm, 0.1 µm, 0.08 µm, 0.05 µm and so on. This further contributes to the improvement of the bonding strength between the first glass member and the second glass member, thus improving the strength of the obtained glass composite. In some other embodiments of the present disclosure, the surface roughness of the first glass member and the second glass member is not greater than 0.2 µm, and the activated surface after the activation has a contact angle with water drops of not greater than 10 degrees. This further contributes to the improvement of the bonding strength between the first glass member and the second glass member, thus improving the strength of the obtained glass composite.

S200: Contact the activated surface of the first glass member with the activated surface of the second glass member to form a glass composite.

According to an embodiment of the present disclosure, the contact causes the unsaturated chemical bonds on the activated surface of the first glass member to bond to the unsaturated chemical bonds on the activated surface of the second glass member to form a stable saturated chemical bond. In this way, a new saturated chemical bond is formed at the contact position, which not only improves the compounding strength of the first glass member and the second glass member, but also improves the inner unity of the glass composite, thereby improving the optical performance of the glass composite.

According to an embodiment of the present disclosure, when the aforementioned contact is made, the unsaturated chemical bonds are bonded on the compounding interface to form a new saturated chemical bond. It should be noted that the compounding interface refers to a contact interface formed by contacting the activated surface of the first glass member with the activated surface of the second glass member.

According to an embodiment of the present disclosure, the above-mentioned contact can be made with heating, and the first glass member and the second glass member need to be heated. In some embodiments of the present disclosure, the heated area can be the same as the area of the first glass member, or the same as the area of the second glass member. In some specific embodiments of the present disclosure, heating takes place at the position where the second glass member and the first glass member are overlapped. As such, the first glass member and the second glass member can be effectively heated and fixed together; and the heat utilization rate is high, the energy consumption is reduced, and the influence of heating on other parts of the glass member is minimized.

According to an embodiment of the present disclosure, the contact takes place at a first predetermined temperature, where the first predetermined temperature does not exceed the softening points of the first glass member and the second glass member. There is almost no surface scald, distortion and unevenness caused by an excessively high temperature, so that the final glass composite has an almost unaffected light transmittance, and an aesthetic appearance.

It should be noted that the softening point of glass member refers to the temperature at which the glass member starts to soften, and the expression "the first predetermined temperature does not exceed the softening points of the first glass member and the second glass member" used herein means that the first predetermined temperature does not exceed the lower one of the softening point of the first glass member and the softening point of the second glass member.

In some embodiments of the present disclosure, the first predetermined temperature is between 200-900° C., such as 200° C., 250° C., 300° C., 350° C., 400° C., 450° C., 500° C., 550° C., 600° C., 650° C., 700° C., 750° C., 800° C., 850° C., and 900° C., etc. Therefore, the first predetermined temperature does not exceed the softening point of the glass members. Due to the low temperature, there is no scald on the outer surface of the glass, no softening of glass occurs, and no deformation or unevenness occurs on the glass surface, whereby the light transmittance of the final glass composite is enhanced, and the glass composite has an aesthetic appearance. If the first predetermined temperature is too high, the glass member is easy to be softened, and scald, deformation, and unevenness may occur to the outer surface. A too high temperature is not conducive to the formation of new saturated chemical bonds between the two glass members, affecting the optical performance of the glass composite. If the first predetermined temperature is too low, the bonding strength between the glass members is low, such that the strength of the formed glass composite is low.

In some specific embodiments of the present disclosure, the first predetermined temperature is between 250-750° C., such as 200° C., 250° C., 300° C., 350° C., 400° C., 450° C., 500° C., 550° C., 600° C., 650° C., 700° C., and 750° C., etc. This is more conducive to the compounding between the first glass member and the second glass member, and there is almost no surface distortion and unevenness caused by an excessively high temperature. Therefore, the finally obtained glass composite has a higher light transmittance and an aesthetic appearance.

According to an embodiment of the present disclosure, the contact is carried out under pressure. It is more advantageous to weld the first glass member and the second glass member together under pressure to form a stronger glass composite, and there are almost no bubbles or fantasy colors in the glass composite. In some embodiments of the present disclosure, the pressure is 0.05-10 MPa, for example, 0.1 MPa, 0.5 MPa, 1.0 MPa, 1.5 MPa, 2.0 MPa, 3.0 MPa, 5.0 MPa, 7.0 MPa, and 9.0 MPa, etc. Therefore, the first glass member and the second glass member are more effectively bonded, and the strength of the glass composite is higher. If the pressure is too large, the glass surface is prone to indentation, and the glass structure is easily deformed. If the pressure is too small, the bonding force between the glass members is relatively low, and bubbles and fantasy colors are likely to appear in the glass composite.

In some specific embodiments of the present disclosure, the glass composite can be prepared through a process comprising the following steps:

Step 1: cleaning a first glass member and a second glass member with a detergent to remove oil stain, and blow drying;

Step 2: activating the cleaned first glass member and second glass member in an activation solution, heating from room temperature to 200° C. for a period of time, cooling naturally, washing off the residual solution on the surface with pure water, and blow drying, to obtain the first glass member and the second glass member having activated surfaces, where the activation mainly aims to increase the unsaturated chemical bonds on the surface of the glass members that are bonded to form a new stable saturated chemical bond when compounded, to promote the subsequent compounding process; and Step 3: contacting the activated surface of the first glass member with the activated surface of the second glass member, heating to a temperature below the glass softening point, and applying a pressure at the same time to compound at least part of the surfaces of the first glass member and the second glass member to form a glass composite.

The present inventors find that the method is simple, convenient, and easy to implement. After the activation, a new saturated chemical bond is formed between the first glass member and the second glass member. The bonding force is stronger, and the formed glass composite has high strength and high inner unity. Moreover, the glass composite has a relatively flat surface, an aesthetic appearance, and an almost unaffected optical performance, the light transmittance is high, and there is almost no fantasy colors and bubbles.

In another aspect of present disclosure, present disclosure provides a casing. According to an embodiment of the present disclosure, at least a part of the casing is formed by the glass composite described above. Therefore, the casing has high light transmittance, good optical performance, and almost no bubbles or fantasy colors, can attain a special-shaped structure, meet the requirements of use in different situations, and have a wide scope of application. Moreover, the preparation method of the casing is simple and easy to operate, thereby overcoming the problem that glass is unlikely to be processed into complex shapes due to its brittleness. The casing can be effectively used in various electronic products (such as mobile phones, and tablet computers, etc.), so as to solve the problem of signal shielding by a metal casing. The casing can be well applied to 5G communication devices, and can give the electronic products more aesthetic and diverse appearances.

According to an embodiment of the present disclosure, the casing is formed by the glass composite described above. Specifically, there are no restrictions on the specific shape, connection mode, and connection position of the first glass member and the second glass member, and flexible selections can be made by those skilled in the art according to the requirements during use.

According to an embodiment of the present disclosure, there are no particular restrictions on the specific shape, and structure of the casing, and flexible selections can be made by those skilled in the art according to the requirements of actual products. In some embodiments of the present disclosure, the first glass member and the second glass member may specifically be of a 2D structure, a 2.5D structure or a 3D structure. The contact surfaces of the first glass member and the second glass member can be a flat surface, a curved surface, or a combination of a flat surface and a curved surface, as long as the two can be brought into contact with each other without clearance. For example, if the activated surface of the first glass member is an upwardly bulged curved surface, then the activated surface of the second glass member is correspondingly an upwardly depressed curved surface. The specific shape and structure can be flexibly selected by those skilled in the art according to actual needs. Specifically, the first glass member and the second glass member can be each independently a sheet glass member, a frame-shaped glass member (that is, a closed ring-shaped glass member, for example, circular ring-shaped glass, rectangular ring-shaped glass, or ring-shaped glass with an outer peripheral edge having straight and curved lines in combination), or a bar-like glass member (such as long bar, round bar, or irregular polygonal bar). In some specific embodiments, referring to FIGS. 6A (rectangular ring-shaped glass) and 6B (circular ring-shaped glass), the first glass member is a sheet glass member, and the second glass member is a frame-shaped glass member, where the frame-shaped glass member is compounded to the outer peripheral edge of the sheet glass member (see FIG. 7A) or the frame-shaped glass member is compounded to the outer peripheral face of the sheet glass member (see FIG. 7B). In some other specific embodiments, referring to FIG. 6C, the first glass member is a sheet glass member, and the second glass member is a bar-shaped glass member, where the bar-shaped glass member is compounded to the outer peripheral edge of the sheet glass member (where specifically, the bar-shaped glass member can be compounded to the outer peripheral edge at one, two or more sides; and see FIG. 7A for the schematic structure of the cross section where the bar-shaped glass member is compounded to two opposing outer peripheral edges), or a frame-shaped glass member is compounded to the outer peripheral face of the sheet glass member (where specifically, the frame-shaped glass member can be compounded to the outer peripheral face at one, two or more sides; and see FIG. 7B for the schematic structure of the cross section where the frame-shaped glass member is compounded to two opposing outer peripheral faces). Of course, the foregoing is only an exemplary description of the casing structure of the present disclosure, and cannot be understood as a limitation of the present disclosure. Accordingly, a glass casing having a stereoscopic structure can be achieved, and various complex 2.5D (two-dimensional), 3D (three-dimensional), and special-shaped structures can be obtained as needed. Moreover, the preparation method of the casing is simple and easy to operate, thereby overcoming the problem that glass is unlikely to be processed into complex shapes due to its brittleness. The casing can be effectively used in various electronic products (such as mobile phones, and tablet computers, etc.), so as to solve the problem of signal shielding by a metal casing. The casing can give the electronic products more aesthetic and diverse appearances.

According to an embodiment of the present disclosure, the inner surface and/or the outer surface of the position where the first glass member and the second glass member are connected is a flat surface, a curved surface, or a combination of a flat surface and a curved surface. Specifically, after the first glass member and the second glass member are compounded, the corresponding position on the outer surface of the composite can be processed to obtain any shape that meets the requirements of use.

According to an embodiment of the present disclosure, the outer surface of the position where the first glass member and the second frame-shaped glass member are connected is a flat surface, a curved surface, or a combination of a flat surface and a curved surface. Specifically, after the first glass member and the second glass member are compounded, the corresponding position on the outer surface of the composite can be processed to obtain any shape that meets the requirements of use. According to some embodiments of the present disclosure, referring to FIG. 8, the outer surface 30 of the position where the first glass member 10 and the second glass member 20 are connected is a curved surface. Thus, a 3D curved glass casing is obtained.

Figure 9:
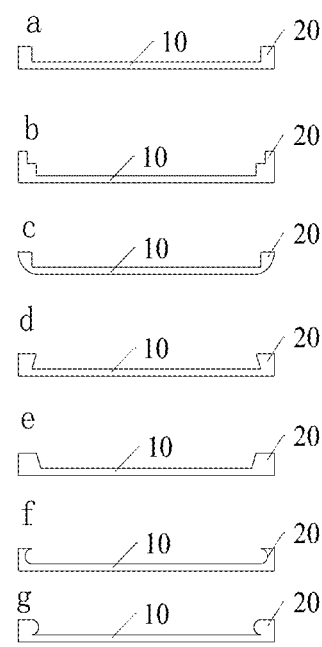
FIG. 9 is a schematic cross-sectional structural view of the casing according to another embodiment of the present disclosure.

According to an embodiment of the present disclosure, referring to FIG. 9, the frame-shaped glass member 20 and the sheet glass member 10 in the casing can form a structure where the position where the sheet glass member and the frame-shaped glass member are connected has an inner right-angled structure (a in FIG. 9); the position where the sheet glass member and the frame-shaped glass member are connected has an internal step structure (b in FIG. 9); the outer surface of the position where the sheet glass member and the frame-shaped glass member are connected is a curved surface (c in FIG. 9); the frame-shaped glass member has an inner surface that is an outwardly bulged curved surface (f in FIG. 9); the frame-shaped glass member has an inner surface that is an inclined surface that gradually tilts inwards (d in FIG. 9); the frame-shaped glass member has an inner surface that is an inclined surface that gradually tilts outwards (e in FIG. 9); and the frame-shaped glass member has an inner surface that is an inwardly bulged curved surface (g in FIG. 9).

According to an embodiment of the present disclosure, there are no particular restrictions on the specific size of the casing, and flexible selections can be made by those skilled in the art according to the requirements.

In another aspect of present disclosure, present disclosure provides a display device. According to an embodiment of the present disclosure, the display device includes the glass composite described above. Therefore, the display device has aesthetic appearance, high light transmittance, and good display effect.

It is to be understood that the glass composite can be a protective cover plate or a back casing of a display device, or can be a base in a color filter substrate or an array substrate, which can be selected according to actual conditions.

According to an embodiment of the present disclosure, the type of the display device is not particularly limited, and includes, for example, but is not limited to, a liquid crystal display device or an OLED display device. The display device may include, in addition to the glass composite, a structure that a conventional display device need to have, such as an array substrate, a color filter substrate, and an electrode, which will not be described here.

In another aspect of present disclosure, present disclosure provides a terminal device. According to an embodiment of the present disclosure, the terminal device includes the display device described above. The present inventors find that the terminal device is aesthetically pleasant, has high strength, can achieve an all-glass appearance, and has good performance.

According to an embodiment of the present disclosure, the terminal device includes at least one of a mobile phone, a tablet computer, a notebook computer, a virtual reality (VR) device, an augmented reality (AR) device, a wearable device, and a game console. Therefore, the scope of application is wide and can satisfy the consumers' consumption experience.

It should be noted that in addition to the display device, the terminal device may also include a structure that a conventional terminal device needs to have, such as a CPU, a connecting circuit, and a packaging structure, which are not described here.

According to an embodiment of the present disclosure, in a general method for preparing the glass composites, the glass members are usually heated to above the softening point and then pressed by a jig to press the glass members together. The glass composite obtained by this method has indentations at the welds, which seriously reduce the optical performance of the glass composite and makes the light transmittance poor. In present disclosure, the first glass member or the second glass member is activated in the activation solution so that the unsaturated chemical bonds are exposed on the surface of the glass member. Then the first glass member and the second glass member are pressed together at a low temperature (lower than the softening point of the glass member), to obtain a glass composite with high bonding strength, almost no indentations on the surface, and good optical performance. Specifically, for example, the obtained glass composite having a thickness of 0.7-0.8 mm has a light transmittance in the visible light band of up to 90% or more.

The examples of the present disclosure are described in detail below.

EXAMPLES

Activation Examples

Activation Example 1

60 g of $K_2Cr_2O_7$ was dissolved in 270 g of water, and 44 ml of concentrated sulfuric acid was slowly added. A first glass member and a second glass member were soaked in the prepared mixed acid solution (for 2 h at room temperature or for 30 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated. The surface roughness of the glass members before activation was 0.612 nm.

Activation Example 2

20 g of $K_2Cr_2O_7$ was dissolved in 270 g of water, and 44 ml of concentrated sulfuric acid was slowly added. A first glass member and a second glass member were soaked in the prepared mixed acid solution (for 6 h at room temperature or for 150 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated. The surface roughness of the glass members before activation was 0.592 nm.

Activation Example 3

30 g of $K_2Cr_2O_7$ was dissolved in 270 g of water, and 44 ml of concentrated sulfuric acid was slowly added. A first glass member and a second glass member were soaked in the prepared mixed acid solution (for 5 h at room temperature or for 120 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated. The surface roughness of the glass members before activation was 0.589 nm.

Activation Example 4

40 g of $K_2Cr_2O_7$ was dissolved in 270 g of water, and 44 ml of concentrated sulfuric acid was slowly added. A first glass member and a second glass member were soaked in the prepared mixed acid solution (for 4 h at room temperature or for 90 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated. The surface roughness of the glass members before activation was 0.659 nm.

Activation Example 5

50 g of $K_2Cr_2O_7$ was dissolved in 270 g of water, and 44 ml of concentrated sulfuric acid was slowly added. A first glass member and a second glass member were soaked in the prepared mixed acid solution (for 3 h at room temperature or for 60 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated. The surface roughness of the glass members before activation was 0.192 nm.

Activation Example 6

A first glass member and a second glass member were soaked in a mixed solution containing 10% hydrofluoric acid and 10% ammonium bifluoride at room temperature for 30 min. Then, the glass members were washed with pure water at room temperature for 20 min and then dried. The surface roughness of the glass members before activation was 0.751 nm.

Activation Example 7

A first glass member and a second glass member were soaked in a mixed solution containing 10% hydrofluoric acid and 10% ammonium bifluoride at room temperature for 35 min. Then, the glass members were washed with pure water at room temperature for 20 min and then dried. The surface roughness of the glass members before activation was 0.526 nm.

Activation Example 8

A first glass member and a second glass member were soaked in a mixed solution containing 5% hydrofluoric acid and 5% ammonium bifluoride at room temperature for 40 min. Then, the glass members were washed with pure water at room temperature for 20 min and then dried. The surface roughness of the glass members before activation was 0.450 nm.

Activation Example 9

A first glass member and a second glass member were soaked in a mixed solution containing 15% hydrofluoric acid and 15% ammonium bifluoride at room temperature for 30 min. Then, the glass members were washed with pure water at room temperature for 20 min and then dried. The surface roughness of the glass members before activation was 0.654 nm.

Example 10

The glass members were soaked in a mixed solution containing 20% hydrofluoric acid and 20% ammonium bifluoride at room temperature for 25 min. Then, the glass members were washed with pure water at room temperature for 20 min and then dried. The surface roughness of the glass members before activation was 0.539 nm.

Example 11

The glass members were soaked in a mixed solution containing 25% hydrofluoric acid and 25% ammonium bifluoride at room temperature for 20 min. Then, the glass members were washed with pure water at room temperature for 20 min and then dried. The surface roughness of the glass members before activation was 0.238 nm.

Example 12

The glass members were soaked in a mixed solution containing 30% hydrofluoric acid and 30% ammonium bifluoride at room temperature for 15 min. Then, the glass members were washed with pure water at room temperature for 20 min and then dried. The surface roughness of the glass members before activation was 0.886 nm.

Example 13

The glass members were soaked in a mixed solution containing 35% hydrofluoric acid and 35% ammonium bifluoride at room temperature for 10 min. Then, the glass members were washed with pure water at room temperature for 20 min and then dried. The surface roughness of the glass members before activation was 0.556 nm.

Example 14

The glass members were soaked in a mixed solution containing 40% hydrofluoric acid and 40% ammonium bifluoride at room temperature for 5 min. Then, the glass members were washed with pure water at room temperature for 20 min and then dried. The surface roughness of the glass members before activation was 0.842 nm.

Activation Example 15

A first glass member and a second glass member were washed with a mixed solution of hydrofluoric acid, sulfuric acid, and the surfactant sodium dodecyl sulfonate, blow dried, then positioned in a mixed solution of hydrogen peroxide and sulfuric acid (1:3), heated at 80° C. for 1 h, and cooled naturally. The residual solution on the surfaces was washed off with pure water and then the glass members were blow dried. In this way, the surfaces of the glass members were activated. The surface roughness of the glass members before activation was 0.610 nm.

Activation Example 16

A first glass member and a second glass member were washed with a mixed solution of hydrofluoric acid, sulfuric acid, and the surfactant sodium dodecyl sulfonate, blow dried, then positioned in a mixed solution of hydrogen peroxide and sulfuric acid (1:2.8), heated at 80° C. for 1 h, and cooled naturally. The residual solution on the surfaces was washed off with pure water and then the glass members were blow dried. In this way, the surfaces of the glass members were activated. The surface roughness of the glass members before activation was 0.741 nm.

Activation Example 17

A first glass member and a second glass member were washed with a mixed solution of hydrofluoric acid, sulfuric acid, and the surfactant sodium dodecyl sulfonate, blow dried, then positioned in a mixed solution of hydrogen peroxide and sulfuric acid (1:2.6), heated at 80° C. for 1 h, and cooled naturally. The residual solution on the surfaces was washed off with pure water and then the glass members were blow dried. In this way, the surfaces of the glass members were activated. The surface roughness of the glass members before activation was 0.843 nm.

Activation Example 18

A first glass member and a second glass member were washed with a mixed solution of hydrofluoric acid, sulfuric acid, and the surfactant sodium dodecyl sulfonate, blow dried, then positioned in a mixed solution of hydrogen peroxide and sulfuric acid (1:2.5), heated at 80° C. for 1 h, and cooled naturally. The residual solution on the surfaces was washed off with pure water and then the glass members were blow dried. In this way, the surfaces of the glass members were activated. The surface roughness of the glass members before activation was 0.431 nm.

Activation Example 19

A first glass member and a second glass member were washed with a mixed solution of hydrofluoric acid, sulfuric acid, and the surfactant sodium dodecyl sulfonate, blow dried, then positioned in a mixed solution of hydrogen peroxide and sulfuric acid (1:2.3), heated at 80° C. for 1 h, and cooled naturally. The residual solution on the surfaces was washed off with pure water and then the glass members were blow dried. In this way, the surfaces of the glass members were activated. The surface roughness of the glass members before activation was 0.607 nm.

Activation Example 20

At room temperature, a first glass member and a second glass member were respectively washed in acetone, a peracetic acid solution or a calcium hypochlorite solution in sequence for 30 min, removed, washed with pure water and dried. 60 g of $K_2Cr_2O_7$ was dissolved in 270 g of water, and 44 ml of concentrated sulfuric acid was slowly added. A first glass member and a second glass member were soaked in the prepared mixed acid solution (for 2 h at room temperature or for 30 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated.

Activation Example 21

At room temperature, a first glass member and a second glass member were respectively washed in acetone, a peracetic acid solution or a calcium hypochlorite solution in sequence for 30 min, removed, washed with pure water and dried. 20 g of $K_2Cr_2O_7$ was dissolved in 270 g of water, and 44 ml of concentrated sulfuric acid was slowly added. A first glass member and a second glass member were soaked in the prepared mixed acid solution (for 6 h at room temperature or for 150 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated.

Activation Example 22

At room temperature, a first glass member and a second glass member were respectively washed in acetone, a peracetic acid solution or a calcium hypochlorite solution in sequence for 30 min, removed, washed with pure water and dried. 30 g of $K_2Cr_2O_7$ was dissolved in 270 g of water, and 44 ml of concentrated sulfuric acid was slowly added. A first glass member and a second glass member were soaked in the prepared mixed acid solution (for 5 h at room temperature or for 120 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated.

Activation Example 23

At room temperature, a first glass member and a second glass member were respectively washed in acetone, a peracetic acid solution or a calcium hypochlorite solution in sequence for 30 min, removed, washed with pure water and dried. 40 g of $K_2Cr_2O_7$ was dissolved in 270 g of water, and 44 ml of concentrated sulfuric acid was slowly added. A first glass member and a second glass member were soaked in the prepared mixed acid solution (for 4 h at room temperature or for 90 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated.

Activation Example 24

At room temperature, a first glass member and a second glass member were respectively washed in acetone, a peracetic acid solution or a calcium hypochlorite solution in sequence for 30 min, removed, washed with pure water and dried. 50 g of $K_2Cr_2O_7$ was dissolved in 270 g of water, and 44 ml of concentrated sulfuric acid was slowly added. A first glass member and a second glass member were soaked in the prepared mixed acid solution (for 3 h at room temperature or for 60 min at 50° C.). The glass members were removed, and the residual chromium ions on the surfaces were washed off with a 10% nitric acid solution. Then the glass members were washed with pure water for 10 min and then blow dried. In this way, the surfaces of the glass members were activated.

Activation Example 25

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 10% hydrofluoric acid and 10% ammonium bifluoride at room temperature for 30 min. Then, the glass members were washed with pure water at room temperature for 20 min and then dried.

Activation Example 26

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 10% hydrofluoric acid and 10% ammonium bifluoride at room temperature for 35 min. Then, the glass members were washed with pure water at room temperature for 20 min and then dried.

Activation Example 27

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 5% hydrofluoric acid and 5% ammonium bifluoride at room temperature for 40 min. Then, the glass members were washed with pure water at room temperature for 20 min and then dried.

Activation Example 28

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 15% hydrofluoric acid and 15% ammonium bifluoride at room temperature for 30 min. Then, the glass members were washed with pure water at room temperature for 20 min and then dried.

Activation Example 29

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 20% hydrofluoric acid and 20% ammonium bifluoride at room temperature for 25 min. Then, the glass members were washed with pure water at room temperature for 20 min and then dried.

Activation Example 30

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 25% hydrofluoric acid and 25% ammonium bifluoride at room temperature for 20 min. Then, the glass members were washed with pure water at room temperature for 20 min and then dried.

Activation Example 31

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 30% hydrofluoric acid and 30% ammonium bifluoride at room temperature for 15 min. Then, the glass members were washed with pure water at room temperature for 20 min and then dried.

Activation Example 32

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 35% hydrofluoric acid and 35% ammonium bifluoride at room temperature for 10 min. Then, the glass members were washed with pure water at room temperature for 20 min and then dried.

Activation Example 33

At room temperature, a first glass member and a second glass member were respectively washed in acetone, a peracetic acid solution or a calcium hypochlorite solution in sequence for 30 min, removed, washed with pure water and dried. A first glass member and a second glass member were soaked in a mixed solution containing 40% hydrofluoric acid and 40% ammonium bifluoride at room temperature for 5 min. Then, the glass members were washed with pure water at room temperature for 20 min and then dried.

Detection Means after Activation

The first glass members and second glass members obtained in all the above activation examples were determined for the contact angle with water drops. Specifically, water was dropped on the activated surface of clean first glass member and second glass member. If the water droplets can expand and wet the surface and the water droplets are visually observed to be round and evenly infiltrate the surface, or the contact angle of water with the glass is determined by a contact angle tester to be less than or equal to 10°, then the glass surface is considered to be clean and activated. The test results show that the contact angle (i.e. contact angle with water drops) of the activated surfaces of the first glass member and the second glass member obtained in all the activation examples is less than or equal to 10°. Specifically, the activated surfaces in Activation Examples 1-33 have respectively a contact angle of 3°, 2°, 3°, 3°, 2°, 3°, 2°, 2°, 3°, 3°, 3°, 2°, 3°, 2°, 2°, 3°, 1°, 3°, 2°, 3°, 2°, 2°, 3°, 1°, 3°, 4°, 2°, 3°, 1°, 4°, 2°, 2°, and 3°.

Compounding Example 1

In this example, the first glass member and the second glass member are both made of Corning GG3 glass with a thickness of 0.7 mm (having a visible light transmittance of 91%-93%).

The method for compounding the first glass member (sheet glass member) and the second glass member (rectangular frame-shaped glass member) is as follows.

The first glass member and the second glass member were activated following the method in Activation Example 15. The surface-activated first glass member and second glass member were put into a vacuum box or a vacuum bag and evacuated (that is, coupling). The second glass member was positioned to the outer peripheral edge of the first glass member by a positioning fixture, CCD or other positioning methods, during which caution was taken to avoid foreign objects or fingers touching the activated surfaces, to avoid contamination of the activated surface causing defects. After coupling, the glass members were heated to 650° C. and a pressure of 0.4 MPa was applied. The temperature and pressure were maintained for 3 hrs, and then the glass members were slowly cooled. In this way, the first glass member and the second glass member were compounded together, and a casing was obtained (see FIG. 6A for the schematic structure).

Figure 16:
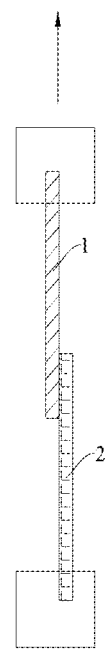
FIG. 16 is a schematic view of a test method for bonding force in Embodiment 1 of the present disclosure.
Figure 17:
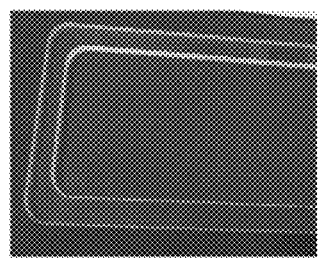
FIG. 17 is a photo showing the casing according to an embodiment of the present disclosure.

In the example, the obtained casing has a light transmittance of more than 91% for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member (see FIG. 17). The bonding strength was tested. The test sample is schematically shown in FIG. 1 (where the length L of the glass member 1 and 2 is 24 mm, the width W1 is 12 mm, and the length L1 of the overlapping area of the two glass members is 6 mm). The test method is schematically shown in FIG. 16. Specifically the sample was stretched at a speed of 5 mm/min by a universal material testing machine until the glass was broken. Test results: When the tensile force is 150 N (i.e., the bonding strength is 2.08 MPa), there is no change at the bonding position, but the first glass member and the second glass member are broken, indicating that the two pieces of glass are compounded into one.

Figure 18:
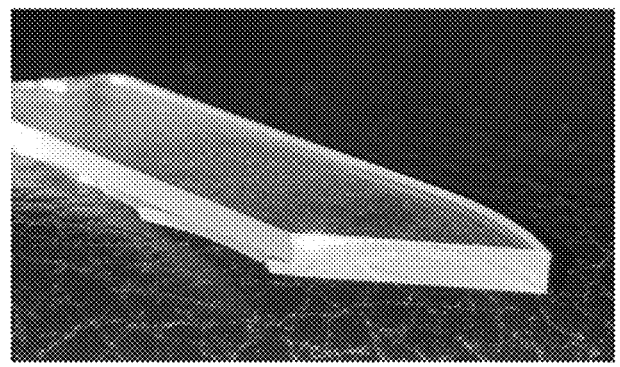
FIG. 18 is a photo showing a cross section of a cut glass composite according to an embodiment of the present disclosure.

The casing obtained above was cut along the thickness direction at the bonding position where the first glass member and the second glass member were connected to form a cross section, and the cross section was polished. No compounding traces are observed visually by naked eyes or under a microscope at a magnification of 500× (see FIG. 18). This indicates that the compounding effect is good. The cross section was corroded in a hydrofluoric acid solution with a mass concentration of 10% for 5 min. The compounding interface of the first glass member and the second glass member was corroded. A crevice having a width of 10-50 μm was visually observed.

Comparative Example 1

Figure 19:
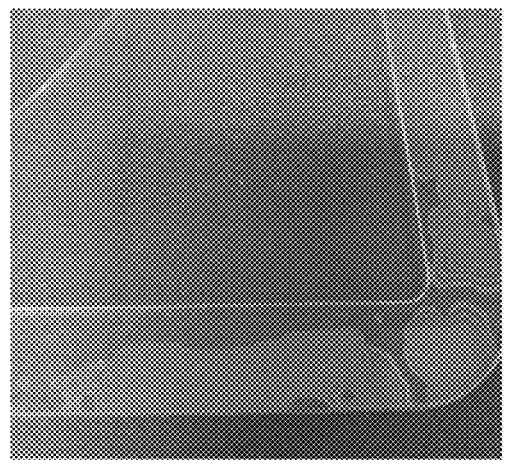
FIG. 19 is a photo showing the casing in Comparative Embodiment 1.
Figure 20:
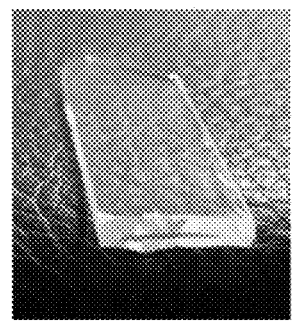
FIG. 20 is a photo showing the cross section of the cut glass composite in Comparative Embodiment 1.

The casing was prepared according to the method of Compounding Example 1, except that the first glass member and the second glass member were not activated. The casing obtained is observed to have obvious fantasy colors and large bubbles (see FIG. 19). The bonding strength was tested by the method of Compounding Example 1. The bonding strength is 10 N. The casing was cut along a direction vertical to the compounding interface. Compounding crevices exist at positions on the compounding interface where bubbles and fantasy colors are present (see FIG. 20). By a steel ball of 32 g falling from a height of 1 meter, the casing was broken, and the glass partially cracked at positions on the compounding interface, indicating that the compounding effect is poor. This indicates that the bonding strength at positions where the bubbles and fantasy colors are present is poor, and the casing is easily broken. This indicates that the bonding strength at positions where the bubbles and fantasy colors are present is poor, and the casing is easily broken.

The casing obtained above was cut along the thickness direction at the bonding position where the first glass member and the second glass member were connected to form a cross section, and the cross section was polished. Crevices are observed visually, indicating that the compounding effect is poor.

Comparative Example 2

The casing was prepared according to the method of Compounding Example 1, except that no activation was performed, and the first glass member and the second glass member were coupled and heated to a temperature above the softening point of the first glass member and the second glass member. The casing is observed to have obvious indentations and impressions at the compounding interface, the deformation is serious, the light transmittance is only about 85% for visible light (wavelength band 380-720 nm), and the local transmittance is less than or equal to 75%, causing a serious impact on the optical performance. The bonding strength was tested by the test method of Compounding Example 1. The bonding strength is consistent with that in Compounding Example 1. By this method, a similar compounding effect is obtained, which, however, cannot meet the appearance requirement.

Compounding Example 2

In this example, the first glass member and the second glass member are both made of Corning GG5 glass with a thickness of 1 mm (having a visible light transmittance of 91%-93%).

The method for compounding the first glass member (sheet glass member) and the second glass member (circular frame-shaped glass member) is as follows.

The first glass member and the second glass member were activated following the method in Activation Example 1. The surface-activated first glass member and second glass member were coupled and heated to 750° C., and then a pressure of 2 MPa was applied. The temperature and pressure were maintained for 5 hrs, and then the glass members were slowly cooled. In this way, the glass members were partially or totally compounded together, and a casing was obtained (see FIG. 6B for the schematic structure).

In the example, the obtained casing has a light transmittance of 91% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The test result shows that when the tensile force is 155 N (that is, 2.15 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 10% for 5 min. The compounding interface of the first glass member and the second glass member was corroded. A crevice having a width of 1-10 μm was visually observed.

Comparative Example 3

The glass composite was prepared according to the method of Compounding Example 2, except that the first glass member and the second glass member were not activated. The casing obtained is observed to have obvious fantasy colors and large bubbles. The bonding strength was tested by the method of Compounding Example 2. The bonding strength is 20 N, indicating that the casing has poor bonding strength and tends to break at the positions where bubbles and fantasy colors are present.

Comparative Example 4

The glass composite was prepared according to the method of Compounding Example 2, except that no activation was performed, and the first glass member and the second glass member were coupled and heated to a temperature above the softening point of the first glass member and the second glass member. The casing is observed to have obvious indentations and impressions at the compounding interface, the deformation is serious, and the light transmittance is only 85% or less for visible light (wavelength band 380-720 nm), causing a serious impact on the optical performance. The bonding strength was tested by the test method of Compounding Example 2. The bonding strength is consistent with that in Compounding Example 2. By this method, a similar compounding effect is obtained, which, however, cannot meet the appearance requirement.

Compounding Example 3

In this example, the first glass member and the second glass member are both made of Schott glass with a thickness of 3 mm (having a visible light transmittance of 91%-95%).

The method for compounding the first glass member (sheet glass member) and the second glass member (bar-shaped glass member) is as follows.

The first glass member and the second glass member were activated following the method in Activation Example 2. The surface-activated first glass member and second glass member were coupled and heated to 700° C., and a pressure of 1 MPa was applied. The temperature and pressure were maintained for 4 hrs, and then the glass members were slowly cooled. In this way, the glass members were partially or totally compounded together, and a casing was obtained (see FIG. 6C for the schematic structure).

In the example, the obtained casing has a light transmittance of 91% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The test result shows that when the tensile force is 160 N (that is, 2 at 0.22 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.5-2 μm was visually observed.

Comparative Example 5

The glass composite was prepared according to the method of Compounding Example 3, except that the first glass member and the second glass member were not activated. The casing obtained is observed to have obvious fantasy colors and large bubbles. The bonding strength was tested by the method of Compounding Example 3. The bonding strength is 15 N, indicating that the casing has poor bonding strength and tends to break at the positions where bubbles and fantasy colors are present.

The casing obtained above was cut along the thickness direction at the bonding position where the first glass member and the second glass member were connected to form a cross section, and the cross section was polished. Crevices are observed at positions where fantasy colors and bubbles are present, indicating that the compounding effect is poor.

Comparative Example 6

The glass composite was prepared according to the method of Compounding Example 3, except that no activation was performed, and the first glass member and the second glass member were coupled and heated to a temperature above the softening point of the first glass member and the second glass member. The casing is observed to have obvious indentations and impressions at the compounding interface, the deformation is serious. The bonding strength was tested by the test method of Compounding Example 3. The bonding strength is consistent with that in Compounding Example 3. By this method, a similar compounding effect is obtained, which, however, cannot meet the appearance requirement.

Compounding Example 4

The process was the same as that in Compounding Example 1, except that the first glass member and the second glass member were treated by the method as described in Activation Example 20.

The obtained casing has a light transmittance of 93% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The test result shows that when the tensile force is 164 N (that is, 2.28 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 10% for 5 min. The compounding interface of the first glass member and the second glass member was corroded. A crevice having a width of 10-50 μm was visually observed.

Activation Example 34

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 1 h in a mixed solution of aqueous ammonia and hydrogen peroxide (volume ratio 1:1) at 40° C. The residual solution on the surface was washed off for 10 min with pure water. Then the glass members were blow dried. In this way, the surfaces of the glass members were activated. The surface roughness of the glass members before activation was 0.543 nm.

Activation Example 35

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 50 min in a mixed solution of aqueous ammonia and hydrogen peroxide (1:2) at 40° C. The residual solution on the surface was washed off for 10 min with pure water. Then the glass members were blow dried. In this way, the surfaces of the glass members were activated. The surface roughness of the glass members before activation was 0.285 nm.

Activation Example 36

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 40 min in a mixed solution of aqueous ammonia and hydrogen peroxide (1:3) at 40° C. The residual solution on the surface was washed off for 10 min with pure water. Then the glass members were blow dried. In this way, the surfaces of the glass members were activated. The surface roughness of the glass members before activation was 0.369 nm.

Activation Example 37

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 30 min in a mixed solution of aqueous ammonia and hydrogen peroxide (1:4) at 40° C. The residual solution on the surface was washed off for 10 min with pure water. Then the glass members were blow dried. In this way, the surfaces of the glass members were activated. The surface roughness of the glass members before activation was 0.745 nm.

Activation Example 38

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 20 min in a mixed solution of aqueous ammonia and hydrogen peroxide (1:5) at 40° C. The residual solution on the surface was washed off for 10 min with pure water. Then the glass members were blow dried. In this way, the surfaces of the glass members were activated. The surface roughness of the glass members before activation was 0.943 nm.

Activation Example 39

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 30 min in a mixed solution of sodium hypochlorite and aqueous ammonia (containing, in percentage by weight, 5% of sodium hypochlorite, 15% of aqueous ammonia, and 80% of deionized water) at room temperature. The residual solution on the surface was washed off for 10 min with pure water. Then the glass members were blow dried. In this way, the surfaces of the glass members were activated.

Activation Example 40

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 20 min in a mixed solution of sodium hypochlorite and aqueous ammonia (containing, in percentage by weight, 10% of sodium hypochlorite, 30% of aqueous ammonia, and 60% of deionized water) at room temperature. The residual solution on the surface was washed off for 10 min with pure water. Then the glass members were blow dried. In this way, the surfaces of the glass members were activated.

Activation Example 41

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 60 min in a mixed solution of sodium hypochlorite and aqueous ammonia (containing, in percentage by weight, 5% of sodium hypochlorite, 5% of aqueous ammonia, and 90% of deionized water) at room temperature. The residual solution on the surface was washed off for 10 min with pure water. Then the glass members were blow dried. In this way, the surfaces of the glass members were activated.

Activation Example 42

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 15 min in a mixed solution of sodium hypochlorite and aqueous ammonia (containing, in percentage by weight, 20% of sodium hypochlorite, 30% of aqueous ammonia, and 50% of deionized water) at room temperature. The residual solution on the surface was washed off for 10 min with pure water. Then the glass members were blow dried. In this way, the surfaces of the glass members were activated.

Detection Means after Activation

The first glass members and second glass members obtained in all the above activation examples were determined for the contact angle with water drops. Specifically, water was dropped on the surface of clean first glass member and second glass member. If the water droplets can expand and wet the surface and the water droplets are visually observed to be round and evenly infiltrate the surface, or the contact angle of water with the glass is determined by a contact angle tester to be less than or equal to 10°, then the glass surface is considered to be clean and activated. The test results show that the contact angle (i.e. contact angle with water drops) of the first glass member and the second glass member obtained in Activation Examples 34-42 is less than or equal to 10°, and specifically 3°, 3°, 1°, 2°, 2°, 3°, 2°, 3°, and 1°.

Compounding Example 5

In this example, the first glass member and the second glass member are both made of Corning GG3 glass with a thickness of 0.7 mm (having a visible light transmittance of 91%-93%).

The method for compounding the first glass member (sheet glass member) and the second glass member (rectangular frame-shaped glass member) was as follows.

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 50 min in a mixed solution of aqueous ammonia and hydrogen peroxide (1:2) at 40° C. The residual solution on the surface was washed off for 10 min with pure water. Then the glass members were blow dried. In this way, the surfaces of the glass members were activated. The surface-activated first glass member and second glass member were brought into contact and heated to 700° C., and a pressure of 0.5 MPa was applied. The temperature and pressure were maintained for 2 hrs. In this way, the glass members were partially or totally compounded together, and a casing was obtained, see FIG. 6A for the schematic structure.

In the example, the obtained casing has a light transmittance of 92% for visible light (wavelength band 380-720 nm), which shows that the optical performance is better, and the performance during use is better. The casing surface is flat and smooth, and there are no visible bubbles, impurity spots, fantasy colors, and other defects at the compounding position. The casing was cut along a direction vertical to the compounding surface, and no compounding crevice is observed at the compounding interface. The bonding strength was tested by the method of Compounding Example 1. The results show that the bonding strength is 151 N (i.e. 2.1 MPa), there is no change at the bonding position, and the glass members are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicates that the compounding effect is good. The cross section was corroded in a hydrofluoric acid solution with a mass concentration of 10% for 5 min. The first glass member and the second glass were visually observed to have crevices having a width of 10-50 μm.

Compounding Example 6

In this example, the first glass member and the second glass member are both made of Schott glass (having a visible light transmittance of 91%-93%).

The method for compounding the first glass member (sheet glass member) and the second glass member (rectangular frame-shaped glass member) was as follows.

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 40 min in a mixed solution of aqueous ammonia and hydrogen peroxide (1:3) at 40° C. The residual solution on the surface was washed off for 10 min with pure water. Then the glass members were blow dried. In this way, the surfaces of the glass members were activated. The surface-activated first glass member and second glass member were brought into contact and heated to 610° C., and a pressure of 1 MPa was applied. The temperature and pressure were maintained for 2 hrs, and then the glass members were slowly cooled. In this way, the glass members were partially or totally compounded together, and a casing was obtained (see FIG. 6A for the schematic structure).

In the example, the obtained casing has a light transmittance of 91% for visible light, which shows that the optical performance is better, and the performance during use is better. The compounding position of the first glass member and the second glass member has no obvious bubbles and fantasy colors. The bonding strength was tested according to the test method in Compounding Example 1. The test result shows that when the tensile force is 159 N (that is, 2.21 MPa), there is no change at the bonding position, but the first glass member or the second glass member is broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicates that the compounding effect is good. The cross section was corroded in a hydrofluoric acid solution with a mass concentration of 40% for 2 min. It is visually observed that obvious crevices are formed at the compounding interface in the cross section.

Compounding Example 7

In this example, the first glass member and the second glass member are both made of Schott glass (having a visible light transmittance of 91%-93%).

The method for compounding the first glass member (sheet glass member) and the second glass member (bar-shaped glass member) is as follows.

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 60 min in a mixed solution of sodium hypochlorite and aqueous ammonia (containing, in percentage by weight, 10% of sodium hypochlorite, 30% of aqueous ammonia, and 60% of deionized water) at room temperature. The residual solution on the surface was washed off for 10 min with pure water. Then the glass members were blow dried. In this way, the surfaces of the glass members were activated. The surface-activated first glass member and second glass member were brought into contact and heated to 450° C., and a pressure of 1.5 MPa was applied. The temperature and pressure were maintained for 5 hrs. Then, the glass members were slowly cooled. In this way, the glass members were partially or totally compounded together, and a casing was obtained, see FIG. 6C for the schematic structure.

In the example, the obtained casing has a light transmittance of 91.5% for visible light (wavelength band 380-720 nm), which shows that the optical performance is better, and the performance during use is better. The outer surfaces of the first glass member and the second glass member are visually observed to be flat and smooth, and the compounding position of the first glass member and the second glass member has no obvious bubbles and fantasy colors. The bonding strength was tested according to the test method in Compounding Example 1. The test result shows that when the tensile force is 155 N (that is, 2.15 MPa), there is no change at the bonding position, but the first glass member or the second glass member is broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicates that the compounding effect is good. The cross section was corroded in a hydrofluoric acid solution with a mass concentration of 20% for 5 min. It is visually observed that obvious crevices having a width of 0.5-20 μm are formed at the compounding interface in the cross section.

Compounding Example 8

In this example, the first glass member and the second glass member are both made of Schott glass (having a visible light transmittance of 91%-93%). The first glass member is of a curved glass shape, and the second glass member is of a curved glass shape. The surface of the first glass member is an upwardly bulged curved surface, and the surface of the second glass member is an upwardly depressed curved surface. The surfaces of the portions at which the two glass members need to be compounded have the same radius of curvature, and continuous contact can be achieved without crevices.

The method for compounding the first glass member and the second glass member is as follows.

At room temperature, a first glass member and a second glass member were respectively washed in acetone, a peracetic acid solution or a calcium hypochlorite solution in sequence for 30 min, removed, washed with pure water and dried. The washed first glass member and second glass member were treated for 40 min in a mixed solution of sodium hypochlorite and aqueous ammonia (containing, in percentage by weight, 20% of sodium hypochlorite, 30% of aqueous ammonia, and 50% of deionized water) at room temperature. The residual solution on the surface was washed off for 10 min with pure water. Then the glass members were blow dried. In this way, the surfaces of the glass members were activated. The surface-activated first glass member and second glass member were brought into contact and heated to 250° C., and a pressure of 2.0 MPa was applied. The temperature and pressure were maintained for 6 hrs. Then, the glass members were slowly cooled. In this way, the glass members were partially or totally compounded together.

In the example, the obtained casing has a light transmittance of more than 92.5% for visible light (wavelength band 380-720 nm), which shows that the optical performance is better, and the performance during use is better. The outer surfaces of the first glass member and the second glass member are observed to be flat and smooth, and there are no obvious bubbles or fantasy colors at the compounding position of the first glass member and the second glass member. The bonding strength was tested according to the method in Compounding Example 1. The bonding strength is 130 N, there is no change at the compounding position, but the glass member is broken.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicates that the compounding effect is good. The cross section was corroded in a hydrofluoric acid solution with a mass concentration of 15% for 5 min. It is visually observed that obvious crevices are formed at the compounding interface in the cross section.

Compounding Example 9

In this example, the first glass member and the second glass member are both made of Schott glass (having a visible light transmittance of 91%-93%). The first glass member is of a curved glass shape, and the second glass member is of a curved glass shape. The surface of the first glass member is an upwardly bulged curved surface, and the surface of the second glass member is an upwardly depressed curved surface. The surfaces of the portions at which the two glass members need to be compounded have the same radius of curvature, and continuous contact can be achieved without crevices.

The method for compounding the first glass member and the second glass member is as follows.

First, the organic pollutant was removed from the first glass member and second glass member by an organic solvent, and then the impurities on the surfaces were removed by using an alkaline detergent with a pH of 14. The first glass member and second glass member were activated for 30 min by immersing in a solution containing, in percentage by weight, 20% of sodium hypochlorite, 30% of aqueous ammonia, and 50% of deionized water at 30° C.

The surface-activated first glass member and second glass member were brought into contact and heated to 750° C., and a pressure of 0.05 MPa was applied. The temperature and pressure were maintained for 3 hrs. Then, the glass members were slowly cooled. In this way, the glass members were partially or totally compounded together.

In the example, the obtained casing has a light transmittance of more than 91% for visible light (wavelength band 380-720 nm), which shows that the optical performance is better, and the performance during use is better. The outer surfaces of the first glass member and the second glass member are observed to be flat and smooth, and there are no obvious bubbles or fantasy colors at the compounding position of the first glass member and the second glass member. The bonding strength was tested according to the method in Compounding Example 1. The bonding strength is 135 N, there is no change at the bonding position, but the glass member is broken.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 30% for 3.5 min. The compounding interface of the first glass member and the second glass member was evenly corroded at a rate that is higher than the corrosion rate of the first glass member and the second glass member. It is visually observed that crevices are formed at the compounding interface in the cross section.

Compounding Example 10

In this example, the first glass member and the second glass member are both made of Corning GG3 glass with a thickness of 0.7 mm (having a visible light transmittance of 91%-93%). The first glass member is of a curved glass shape, and the second glass member is of a curved glass shape. The surface of the first glass member is an upwardly bulged curved surface, and the surface of the second glass member is an upwardly depressed curved surface. The surfaces of the portions at which the two glass members need to be compounded have the same radius of curvature, and continuous contact can be achieved without crevices.

The method for compounding the first glass member and the second glass member is as follows.

The first glass member and the second glass member were activated following the method in Activation Example 34. The surface-activated first glass member and second glass member were brought into contact and heated to 550° C., and a pressure of 1.0 MPa was applied. The temperature and pressure were maintained for 3 hours, and then the glass members were slowly cooled. In this way, the glass members were partially or totally compounded together.

In the example, the obtained casing has a light transmittance of more than 91% for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The bonding strength is 130 N, there is no change at the bonding position, but the glass member is broken.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 20 min. The compounding interface of the first glass member and the second glass member was corroded. Crevices were visually observed.

Activation Example 43

The oil stains on the surfaces were removed by washing the first glass member and second glass member with trichloroethylene for 20 min, and then the first glass member and second glass member were irradiated with ultraviolet light for 0.5 h to obtain glass members with clean and activated surfaces.

Activation Example 44

The oil stains on the surfaces were removed by washing the first glass member and second glass member with trichloroethylene for 20 min, and then the first glass member and second glass member were irradiated with ultraviolet light for 0.8 h to obtain glass members with clean and activated surfaces.

Activation Example 45

The oil stains on the surfaces were removed by washing the first glass member and second glass member with trichloroethylene for 20 min, and then the first glass member and second glass member were irradiated with ultraviolet light for 1 h to obtain glass members with clean and activated surfaces.

Activation Example 46

The oil stains on the surfaces were removed by washing the first glass member and second glass member with trichloroethylene for 20 min, and then the first glass member and second glass member were irradiated with ultraviolet light for 1.2 h to obtain glass members with clean and activated surfaces. The surface roughness of the glass members before activation was 0.203 nm.

Activation Example 47

The oil stains on the surfaces were removed by washing the first glass member and second glass member with trichloroethylene for 20 min, and then the first glass member and second glass member were irradiated with ultraviolet light for 1.5 h to obtain glass members with clean and activated surfaces.

Activation Example 48

The oil stains on the surfaces were removed by washing the first glass member and second glass member with trichloroethylene for 20 min, and then the cleaned glass members were positioned in an ozone-generating device and irradiated with ultraviolet light for 5 min. This is because ozone provides highly reactive atomic oxygen, which can form a volatile substance with free radicals generated after the dissociation of the dirt and thus enable an activated surface.

Activation Example 49

The oil stains on the surfaces were removed by washing the first glass member and second glass member with trichloroethylene for 20 min, and then the cleaned glass members were positioned in an ozone-generating device and irradiated with ultraviolet light for 8 min.

Activation Example 50

The oil stains on the surfaces were removed by washing the first glass member and second glass member with trichloroethylene for 20 min, and then the cleaned glass members were positioned in an ozone-generating device and irradiated with ultraviolet light for 10 min.

Activation Example 51

The oil stains on the surfaces were removed by washing the first glass member and second glass member with trichloroethylene for 20 min, and then the cleaned glass members were positioned in an ozone-generating device and irradiated with ultraviolet light for 15 min.

Activation Example 52

The oil stains on the surfaces were removed by washing the first glass member and second glass member with trichloroethylene for 20 min, and then the cleaned glass members were positioned in an ozone-generating device and irradiated with ultraviolet light for 20 min.

Activation Example 53

The oil stains on the surfaces were removed by washing the first glass member and second glass member with trichloroethylene for 20 min, and then the first glass member and second glass member were irradiated with ultraviolet light for 12 h to obtain glass members with clean and activated surfaces.

Detection Means after Activation

The first glass members and second glass members obtained in all the above activation examples were determined for the contact angle with water drops. Specifically, water was dropped on the activated surface of clean first glass member and second glass member. If the water droplets can expand and wet the surface and the water droplets are visually observed to be round and evenly infiltrate the surface, or the contact angle of water with the glass is determined by a contact angle tester to be less than or equal to 10°, then the glass surface is considered clean and activated. The test results show that the contact angle (i.e. contact angle with water drops) of the activated surfaces of the first glass member and the second glass member obtained in all the activation examples is less than or equal to 10°. Specifically, the activated surfaces in Activation Examples 43-53 have respectively a contact angle of 4°, 2°, 3°, 3°, 3°, 4°, 2°, 3°, 2°, 3°, and 2°.

Compounding Example 11

In this example, the first glass member and the second glass member are both made of Corning GG3 glass with a thickness of 0.7 mm (having a visible light transmittance of 91%-93%).

The method for compounding the first glass member (sheet glass member) and the second glass member (rectangular frame-shaped glass member) is as follows.

The first glass member and the second glass member were activated following the method in Activation Example 43. The surface-activated first glass member and second glass member were put into a vacuum box or a vacuum bag and evacuated, to contact the lower surface of the first glass member with the upper surface of the second glass member. The second glass member was positioned to the outer peripheral edge of the first glass member by a positioning fixture, CCD or other positioning methods, during which caution was taken to avoid foreign objects or fingers touching the activated surfaces, to avoid contamination of the activated surface causing defects. The glass members were heated to 650° C. and a pressure of 0.3 MPa was applied. The temperature and pressure were maintained for 3 hours, and then the glass members were slowly cooled. In this way, the first glass member and the second glass member were compounded together, and a casing was obtained, see FIG. 6A for the schematic structure.

In the example, the obtained casing has a light transmittance of more than 90% for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member (see FIG. 9). The bonding strength was tested according to the method in Compounding Example 1. The test result shows that when the tensile force is 151 N (that is, 2.1 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 10% for 5 min. The compounding interface of the first glass member and the second glass member was corroded. A crevice having a width of 10-50 µm was visually observed.

Compounding Example 12

In this example, the first glass member and the second glass member are both made of Corning GG5 glass with a thickness of 1 mm (having a visible light transmittance of 91%-93%).

The method for compounding the first glass member (sheet glass member) and the second glass member (rectangular frame-shaped glass member) was as follows.

The first glass member and the second glass member were activated following the method in Activation Example 44. The surface-activated first glass member and second glass member were brought into contact at the activated surfaces and heated to 700° C., and a pressure of 1 MPa was applied. The temperature and pressure were maintained for 3 hours, and then the glass members were slowly cooled. In this way, the glass members were partially or totally compounded together, and a casing was obtained, see FIG. 6A for the schematic structure.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The test result shows that when the tensile force is 156 N (that is, 2.16 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 10% for 5 min. The compounding interface of the first glass member and the second glass member was corroded. A crevice having a width of 1-20 µm was visually observed.

Compounding Example 13

In this example, the first glass member and the second glass member are both made of Corning GG3 glass with a thickness of 3 mm (having a visible light transmittance of 91%-95%).

The method for compounding the first glass member (sheet glass member) and the second glass member (bar-shaped glass member) is as follows.

The first glass member and the second glass member were activated following the method in Activation Example 43. The surface-activated first glass member and second glass member were brought into contact at the activated surfaces and heated to 750° C., and a pressure of 2 MPa was applied. The temperature and pressure were maintained for 4 hrs, and then the glass members were slowly cooled. In this way, the glass members were partially or totally compounded together, and a casing was obtained, see FIG. 6C for the schematic structure.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The test result shows that when the tensile force is 161 N (that is, 2.23 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.1-30 µm was visually observed.

Compounding Example 14

In this example, the first glass member and the second glass member are both made of Schott glass with a thickness of 3 mm (having a visible light transmittance of 91%-95%). The first glass member is of a flat glass shape, and the second glass member is of a curved glass shape. The method for compounding the first glass member and the second glass member is as follows.

The first glass member and the second glass member were activated following the method in Activation Example 46. The surface-activated first glass member and second glass member were brought into contact at the activated surfaces and heated to 750° C., and then a pressure of 2 MPa was applied. The temperature and pressure were maintained for 4 hrs, and then the glass members were slowly cooled. In this way, the glass members were partially or totally compounded together.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The test result shows that when the tensile force is 161 N (that is, 2.23 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.2-2 μm was visually observed.

Compounding Example 15

In this example, the first glass member and the second glass member are both made of Schott glass with a thickness of 3 mm (having a visible light transmittance of 91%-95%). The first glass member is of a curved glass shape, and the second glass member is of a flat glass shape. The method for compounding the first glass member and the second glass member is as follows.

The first glass member and the second glass member were activated following the method in Activation Example 47. The surface-activated first glass member and second glass member were brought into contact at the activated surfaces and heated to 750° C., and then a pressure of 2 MPa was applied. The temperature and pressure were maintained for 4 hrs, and then the glass members were slowly cooled. In this way, the glass members were partially or totally compounded together.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in Compounding Example 1. The test result shows that when the tensile force is 161 N (that is, 2.23 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.2-2 μm was visually observed.

Compounding Example 16

In this example, the first glass member and the second glass member are both made of Schott glass with a thickness of 3 mm (having a visible light transmittance of 91%-95%). The first glass member is of a curved glass shape, and the second glass member is of a curved glass shape. The surface of the first glass member is an upwardly bulged curved surface, and the surface of the second glass member is an upwardly depressed curved surface. The surfaces of the portions at which the two glass members need to be compounded have the same radius of curvature, and continuous contact can be achieved without crevices. The method for compounding the first glass member and the second glass member is as follows.

The first glass member and the second glass member were activated following the method in Activation Example 48. The surface-activated first glass member and second glass member were brought into contact at the activated surfaces and heated to 750° C., and then a pressure of 2 MPa was applied. The temperature and pressure were maintained for 4 hours, and then the glass members were slowly cooled. In this way, the glass members were partially or totally compounded together.

Figure 8:
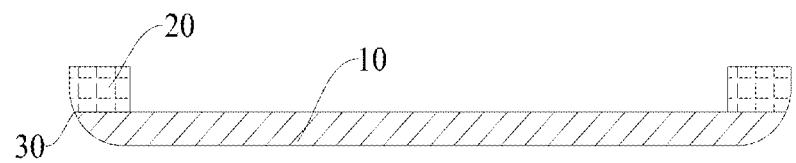
FIG. 8 is a schematic cross-sectional structural view of the casing according to another embodiment of the present disclosure.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested. The test sample is schematically shown in FIG. 8 (where the length L of the glass member 1 and 2 is 24 mm, the width W1 is 12 mm, and the length L1 of the overlapping area of the two glass members is 6 mm). The test method is schematically shown in FIG. 9. Specifically, the sample was stretched at a speed of 5 mm/min by a universal material testing machine until the glass was broken.

Test results: When the tensile force is 161 N (i.e., 2.23 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.2-2 μm was visually observed.

Compounding Example 17

In this example, the first glass member and the second glass member are both made of Schott glass with a thickness of 3 mm (having a visible light transmittance of 91%-95%).

The method for compounding the first glass member and the second glass member is as follows.

The first glass member and the second glass member were activated following the method in Activation Example 49. The surface-activated first glass member and second glass member were brought into contact at the activated surfaces and heated to 750° C., and then a pressure of 2 MPa was applied. The temperature and pressure were maintained for 4 hours, and then the glass members were slowly cooled. In this way, the glass members were partially or totally compounded together.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in the compounding examples. The test result shows that when the tensile force is 161 N (that is, 2.23 MPa), there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.2-2 μm was visually observed.

Compounding Example 18

In this example, the first glass member and the second glass member are both made of Schott glass with a thickness of 3 mm (having a visible light transmittance of 91%-95%).

The method for compounding the first glass member and the second glass member is as follows.

The first glass member and the second glass member were activated following the method in Activation Example 50. The surface-activated first glass member and second glass member were brought into contact at the activated surfaces and heated to 750° C., and then a pressure of 2 MPa was applied. The temperature and pressure were maintained for 4 hours, and then the glass members were slowly cooled. In this way, the glass members were partially or totally compounded together.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in the compounding examples. The test result shows that when the tensile force is 161 N, there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.2-2 μm was visually observed.

Compounding Example 19

In this example, the first glass member and the second glass member are both made of Schott glass with a thickness of 3 mm (having a visible light transmittance of 91%-95%).

The method for compounding the first glass member and the second glass member is as follows.

The first glass member and the second glass member were activated following the method in Activation Example 51. The surface-activated first glass member and second glass member were brought into contact at the activated surfaces and heated to 750° C., and then a pressure of 2 MPa was applied. The temperature and pressure were maintained for 4 hours, and then the glass members were slowly cooled. In this way, the glass members were partially or totally compounded together.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in the compounding examples. The test result shows that when the tensile force is 161 N, there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.2-2 μm was visually observed.

Compounding Example 20

In this example, the first glass member and the second glass member are both made of Schott glass with a thickness of 3 mm (having a visible light transmittance of 91%-95%).

The method for compounding the first glass member and the second glass member is as follows.

The first glass member and the second glass member were activated following the method in Activation Example 52. The surface-activated first glass member and second glass member were brought into contact at the activated surfaces and heated to 750° C., and then a pressure of 2 MPa was applied. The temperature and pressure were maintained for 4 hours, and then the glass members were slowly cooled. In this way, the glass members were partially or totally compounded together.

In the example, the obtained casing has a light transmittance of 90% or more for visible light (wavelength band 380-720 nm), which shows that the optical performance is better, and the performance during use is better. The outer surfaces of the first glass member and the second glass member are visually observed to be flat and smooth, and there are no obvious bubbles or fantasy colors at the compounding position of the first glass member and the second glass member. The bonding strength was tested according to the method in the compounding examples. The test result shows that when the tensile force is 161 N, there is no change at the bonding position, but the first glass member and the second glass member are broken, indicating that the two pieces of glass are compounded into one.

The casing obtained above was cut along the thickness direction at the bonding position where the first glass member and the second glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 5% for 5 min. The compounding interface of the first glass member and the second glass member was corroded. A crevice having a width of 0.2-2 μm was visually observed.

Activation Example 54

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, and washed with $O_2$ plasma for 10 min at an excitation frequency of 13.56 MHz, to remove the organics on the surfaces and activate the surfaces.

Activation Example 55

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, and washed with $N_2/H_2$ plasma for 10 min at an excitation frequency of 13.56 MHz, to remove the organics on the surfaces and activate the surfaces.

Activation Example 56

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, washed with $O_2$ plasma for 5 min at an excitation frequency of 13.56 MHz to remove the organics on the surfaces, and washed with $N_2/H_2$ plasma for 5 min, to remove the oxides on the surfaces and activate the surfaces.

Activation Example 57

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, washed with $O_2$ plasma for 10 min at an excitation frequency of 13.56 MHz to remove the organics on the surfaces, and washed with $N_2/H_2$ plasma for 5 min, to remove the oxides on the surfaces and activate the surfaces.

Activation Example 58

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, washed with $O_2$ plasma for 5 min at an excitation frequency of 13.56 MHz to remove the organics on the surfaces, and washed with $N_2/H_2$ plasma for 10 min, to remove the oxides on the surfaces and activate the surfaces.

Activation Example 59

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, washed with $O_2$ plasma for 10 min at an excitation frequency of 13.56 MHz to remove the organics on the surfaces, and washed with $N_2/H_2$ plasma for 10 min, to remove the oxides on the surfaces and activate the surfaces. The surface roughness of the glass members before activation was 0.512 nm.

Activation Example 60

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, washed with $O_2$ plasma for 10 min at an excitation frequency of 13.56 MHz to remove the organics on the surfaces, and washed with $N_2/H_2$ plasma for 15 min, to remove the oxides on the surfaces and activate the surfaces.

Activation Example 61

At room temperature, a first glass member and a second glass member were respectively washed in acetone, a peracetic acid solution or a calcium hypochlorite solution in sequence for 30 min, removed, washed with pure water and dried. The washed first glass member and second glass member were positioned in a plasma dry cleaner, washed with $O_2$ plasma for 15 min at an excitation frequency of 13.56 MHz to remove the organics on the surfaces, and washed with $N_2/H_2$ plasma for 15 min, to remove the oxides on the surfaces and activate the surfaces.

Detection Means after Activation

The first glass members and second glass members obtained in all the above activation examples were determined for the contact angle with water drops. Specifically, water was dropped on the activated surface of clean first glass member and second glass member. If the water droplets can expand and wet the surface and the water droplets are visually observed to be round and evenly infiltrate the surface, or the contact angle of water with the glass is determined by a contact angle tester to be less than or equal to 10°, then the glass surface is considered to be clean and activated. The test results show that the contact angle (i.e. contact angle with water drops) of the activated surfaces of the first glass member and the second glass member obtained in all the activation examples is less than or equal to 10°. Specifically, the activated surfaces in Activation Examples 54-61 have respectively a contact angle of 7°, 5°, 4°, 4°, 3°, 2°, 3°, and 2°.

Compounding Example 21

In this example, the sheet glass member (first glass member) and the rectangular frame-shaped glass member (second glass member) are both made of Schott glass (having a visible light transmittance of 91%-93%).

The method for compounding the sheet glass member and the frame-shaped glass member is as follows.

The sheet glass member and the frame-shaped glass member were activated following the method in Activation Example 59. The surface-activated sheet glass member and frame-shaped glass member were put into a vacuum box or a vacuum bag and evacuated (that is, coupling). The frame-shaped glass member was positioned to the outer peripheral edge of the sheet glass member by a positioning fixture, CCD or other positioning methods, during which caution was taken to avoid foreign objects or fingers touching the activated surfaces, to avoid contamination of the activated surface causing defects. After coupling, the glass members were heated to 600° C. and a pressure of 0.84 MPa was applied. The temperature and pressure were maintained for 2 hrs, and then the glass members were slowly cooled. In this way, the glass members were partially or totally compounded together, and a casing was obtained, see FIG. 6A for the schematic structure.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and no obvious bubbles or fantasy colors are visually observed at the compounding position of the sheet glass member and the frame-shaped glass member (see FIG. 9). The bonding strength was tested according to the method in Compounding Example 1. The result shows that the bonding strength is 140 N (that is, 1.94 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 40% for 2 min. It is visually observed that obvious crevices are formed at the compounding interface in the cross section.

Compounding Example 22

In this example, the sheet glass member (first glass member) and the rectangular frame-shaped glass member (second glass member) are both made of Corning GG3 glass (having a visible light transmittance of 91%-93%).

The method for compounding the sheet glass member and the frame-shaped glass member is as follows.

The sheet glass member and the frame-shaped glass member were activated following the method in Activation Example 59. The surface-activated sheet glass member and frame-shaped glass member were coupled, heated to 450° C. and a pressure of 1.0 MPa was applied. The temperature and pressure were maintained for 3 hours, and then the glass members were slowly cooled. In this way, the glass members were partially or totally compounded together, and a casing was obtained, see FIG. 6A for the schematic structure.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested according to the method in Compounding Example 1. The bonding strength is 135 N (that is, 1.88 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces were observed visually by naked eyes or under a microscope at a magnification of 500×. This indicates that the compounding effect is good. The cross section was corroded in a hydrofluoric acid solution with a mass concentration of 20% for 5 min. It is visually observed that obvious crevices having a width of 20-100 μm are formed at the compounding interface in the cross section.

Compounding Example 23

In this example, the sheet glass member (first glass member) and the circular frame-shaped glass member (second glass member) are both made of Schott glass (having a visible light transmittance of 91%-93%).

The method for compounding the sheet glass member and the frame-shaped glass member is as follows.

The sheet glass member and the frame-shaped glass member were activated following the method in Activation Example 59. The surface-activated sheet glass member and frame-shaped glass member were coupled and heated to 250° C., and a pressure of 2.0 MPa was applied. The temperature and pressure were maintained for 3 hours, and then the glass members were slowly cooled. In this way, the glass members were partially or totally compounded together, and a casing was obtained (see FIG. 6A for the schematic structure).

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested according to the method in Compounding Example 1. The bonding strength is 130 N (that is, 1.8 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces were observed visually by naked eyes or under a microscope at a magnification of 500×. This indicates that the compounding effect is good. The cross section was corroded in a hydrofluoric acid solution with a mass concentration of 15% for 5 min. It is visually observed that obvious crevices are formed at the compounding interface in the cross section.

Compounding Example 24

In this example, the sheet glass member (first glass member) and the bar-shaped glass member (second glass member) are both made of Schott glass (having a visible light transmittance of 91%-93%).

The method for compounding the sheet glass member and the frame-shaped glass member is as follows.

The sheet glass member and the bar-shaped glass member were activated following the method in Activation Example 59. The surface-activated sheet glass member and bar-shaped glass member were coupled, heated to 750° C. and a pressure of 0.05 MPa was applied. The temperature and pressure were maintained for 3 hours, and then the glass members were slowly cooled. In this way, the glass members were partially or totally compounded together, and a casing was obtained, see FIG. 6C for the schematic structure.

In the example, the obtained casing has a light transmittance of more than 91% for visible light (wavelength band 380-720 nm), which shows that the optical performance is better, and the performance during use is better. The outer surfaces of the sheet glass member and the bar-shaped glass member are observed to be flat and smooth, and there are no obvious bubbles or fantasy colors at the compounding position of the sheet glass member and the bar-shaped glass member. The bonding strength was tested according to the method in Compounding Example 1. The bonding strength is 135 N, there is no change at the bonding position, but the glass member is broken.

The casing obtained above was cut along the thickness direction at the bonding position where the sheet glass member and the bar-shaped glass member were connected to form a cross section, and the cross section was polished. No compounding traces were observed visually by naked eyes or under a microscope at a magnification of 500×. This indicated that the compounding effect is good. The cross section was corroded in a hydrofluoric acid solution with a mass concentration of 30% for 3.5 min. The compounding interface of the sheet glass member and the bar-shaped glass member was evenly corroded at a rate that is higher than the corrosion rate of the sheet glass member and the bar-shaped glass member. It is visually observed that crevices are formed at the compounding interface in the cross section.

Compounding Example 25

The process was the same as that in Compounding Example 21, except that the sheet glass member (first glass member) and the frame-shaped glass member (second glass member) were activated by the method as described in Activation Example 54.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested. The test result shows that the bonding strength is 129 N (that is, 1.8 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 30% for 3 min. It is visually observed that obvious crevices are formed at the compounding interface in the cross section.

Compounding Example 26

The process was the same as that in Compounding Example 21, except that the sheet glass member (first glass member) and the frame-shaped glass member (second glass member) were activated by the method as described in Activation Example 55.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested. The results show that the bonding strength is 131 N (that is, 1.82 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 20% for 4 min.

It is visually observed that obvious crevices are formed at the compounding interface in the cross section.

Compounding Example 27

The process was the same as that in Compounding Example 21, except that the sheet glass member (first glass member) and the frame-shaped glass member (second glass member) were activated by the method as described in Activation Example 56.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested. The test results show that the bonding strength is 145 N (that is, 2.0 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 15% for 7 min. It is visually observed that obvious crevices are formed at the compounding interface in the cross section.

Compounding Example 28

The process was the same as that in Compounding Example 21, except that the sheet glass member (first glass member) and the frame-shaped glass member (second glass member) were activated by the method as described in Activation Example 57.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested. The test results show that the bonding strength is 148 N (that is, 2.05 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 25% for 8 min. It is visually observed that obvious crevices are formed at the compounding interface in the cross section.

Compounding Example 29

The process was the same as that in Compounding Example 21, except that the sheet glass member (first glass member) and the frame-shaped glass member (second glass member) were activated by the method as described in Activation Example 58.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested. The test results show that the bonding strength is 149 N (that is, 2.06 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 35% for 5 min. It is visually observed that obvious crevices are formed at the compounding interface in the cross section.

Compounding Example 30

The process was the same as that in Compounding Example 21, except that the sheet glass member (first glass member) and the frame-shaped glass member (second glass member) were activated by the method as described in Activation Example 60.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested. The test results show that the bonding strength is 150 N (that is, 2.08 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 10% for 10 min. It is visually observed that obvious crevices are formed at the compounding interface in the cross section.

Compounding Example 31

The process was the same as that in Compounding Example 21, except that the sheet glass member (first glass member) and the frame-shaped glass member (second glass member) were activated by the method as described in Activation Example 61.

In the example, the obtained casing has a light transmittance of more than 91% for visible light (wavelength band 380-720 nm), which shows that the optical performance is better, and the performance during use is better. The outer surfaces of the sheet glass member and the frame-shaped glass member are observed to be flat and smooth, and there are no obvious bubbles or fantasy colors at the compounding position of the sheet glass member and the frame-shaped glass member. The bonding strength was tested. The test results show that the bonding strength is 151 N (that is, 2.10 MPa), there is no change at the bonding position, but the glass member is broken.

The casing obtained above was cut along the thickness direction at the bonding position where the sheet glass member and the frame-shaped glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 5% for 10 min. It is visually observed that obvious crevices are formed at the compounding interface in the cross section.

Compounding Example 32

The process was the same as that in Compounding Example 21, except that the first glass member is of a curved glass shape, and the second glass member is of a curved glass shape; the surface of the first glass member is an upwardly bulged curved surface, and the surface of the second glass member is an upwardly depressed curved surface; and the surfaces of the portions at which the two glass members need to be compounded have the same radius of curvature, and continuous contact can be achieved without crevices.

In the example, the obtained casing has a light transmittance of more than 91% for visible light (wavelength band 380-720 nm), which shows that the optical performance is better, and the performance during use is better. The outer surfaces of the first glass member and the second glass member are observed to be smooth, and there are no obvious bubbles or fantasy colors at the compounding position of the first glass member and the second glass member. The bonding strength was tested. The test results show that the bonding strength is 140 N (that is, 1.94 MPa), there is no change at the bonding position, but the glass member is broken.

The casing obtained above was cut along the thickness direction at the bonding position where the first glass member and the second glass member were connected to form a cross section, and the cross section was polished. No compounding traces or crevices were observed visually by naked eyes or under a microscope at a magnification of 500×. This indicates that the compounding effect is good. The cross section was corroded in a hydrofluoric acid solution with a mass concentration of 5% for 10 min. It is visually observed that obvious crevices are formed at the compounding interface in the cross section.

In the description of the present disclosure, it can be understood that, terms "first" and "second" are used only for a purpose of description, and shall not be construed as indicating or implying relative importance or implying a quantity of indicated technical features. Therefore, the features defined by "first", and "second" may explicitly or implicitly include one or more features. In the description of the present disclosure, unless otherwise specifically limited, "a plurality of" means two or more than two.

In the description of the present specification, the description of the reference terms "an embodiment", "some embodiments", "specific example", "some examples" or the like means that specific features, structures, materials or characteristics described in combination with the embodiment are included in at least one embodiment of the present disclosure. In the present specification, the illustrative expression of the above terms is not necessarily referring to the same embodiment or example. Moreover, the described specific features, structures, materials or characteristics may be combined in any suitable manners in one or more embodiments. In addition, where there are no contradictions, the various embodiments or examples described in this specification and features of various embodiments or examples can be combined by those skilled in the art.

Although the embodiments of the present disclosure have been shown and described above, it can be understood that the foregoing embodiments are exemplary and should not be understood as limitation to the present disclosure. A person of ordinary skill in the art can make changes, modifications, replacements, or variations to the foregoing embodiments within the scope of the present disclosure.

What is claimed is:

1. A glass composite, comprising:
a first glass member and a second glass member, wherein:
the first glass member and the second glass member are at least partially connected with each other at a first activated surface of the first glass member and a second activated surface of the second glass member; and
the glass composite has a light transmittance not lower than 95% of the light transmittance of the one, with the lower light transmittance, of the first glass member and the second glass member, wherein:
the first activated surface is at least a part of a surface of the first glass member,
the second activated surface is at least a part of a surface of the second glass member,
the first activated surface and the second activated surface are in direct contact with each other without an interlayer, and
the first glass member and the second glass member are bonded to each other by stable saturated chemical bonds formed by unsaturated chemical bonds on the first activated surface of the first glass member and unsaturated chemical bonds on the second activated surface of the second glass member.

2. The glass composite according to claim 1, wherein: at least one of the first glass member and the second glass member is formed by a plurality of sub-glass members, and at least part of the surfaces of two adjacent sub-glass members are connected.

3. The glass composite according to claim 2, wherein the first glass member or the second glass member formed by the plurality of sub-glass members has a light transmittance not lower than 95% of the light transmittance of the sub-glass member.

4. The glass composite according to claim 1, wherein:
the first glass member and the second glass member are connected to form a contact interface,
a cross section along the direction perpendicular to the contact interface is defined as a first cross section,
the first cross section has no crevices when observed visually by naked eyes or observed under a microscope at a magnification of 500×, and
the first cross section has crevices at the contact interface after contacting with a hydrofluoric acid solution, wherein crevices of the first cross section have a width of 0.1-300 µm after it is corroded for 30 s-1200 s in the hydrofluoric acid solution having a mass concentration of 5%-40% crevice.

5. The glass composite according to claim 1, wherein at least one surface of the first glass member or the second glass member is provided with an anti-reflection film.

6. The glass composite according to claim 1, wherein the glass composite is prepared through a process comprising:
performing activation treatment on at least a part of the surface of the first glass member and at least a part of the surface of the second glass member, to form the first activated surface and the second activated surface, respectively; and
contacting the first activated surface of the first glass member with the second activated surface of the second glass member to form the glass composite.

7. The glass composite according to claim 6, wherein the process further comprises:
before performing activation treatment, cleaning the surface of the first glass member and the second glass member to be activated,
wherein the activation treatment is to produce unsaturated chemical bonds on the surfaces of the first glass member and the second glass member, and
wherein the contact makes the unsaturated chemical bonds on the activated surfaces of the first glass member and the second glass member combined to form the saturated chemical bonds.

8. The glass composite according to claim 6, wherein:
the activation treatment is carried out by at least one of: a treatment with an activation solution that is acidic or basic; a plasma treatment; and a UV treatment;
the pH of the activation solution is not greater than 4, or the pH of the activation solution is 10-14; and
the activation solution comprises:
an acid or an alkali; and
an auxiliary agent, comprising at least one of: an oxidizing agent, an alcohol, an organic acid, a carbohydrate, an amino acid, and a surfactant.

9. The glass composite according to claim 8, wherein:
the acid comprises at least one of: sulfuric acid, hydrochloric acid, hydrogen fluoride, ammonium bifluoride, nitric acid and acetic acid;
the alkali comprises at least one of: sodium carbonate, sodium bicarbonate, potassium hydroxide, sodium hydroxide and aqueous ammonia; and
the oxidizing agent comprises at least one of: potassium dichromate, potassium permanganate, hydrogen peroxide and nitric acid.

10. The glass composite according to claim 9, wherein the activation solution comprises:
a raw material for forming the activation solution, comprising: a hydrogen peroxide and a sulfuric acid, wherein the activation solution comprises a mixed solution of hydrogen peroxide and sulfuric acid in a volume ratio of (1:3)-(3:7);
a raw material for forming the activation solution, comprising: potassium dichromate and sulfuric acid, wherein the activation solution comprises a mixture of potassium dichromate and sulfuric acid in a mass ratio of (1:4)-(3:4);
a raw material for forming the activation solution, comprising: hydrogen fluoride and ammonium bifluoride, wherein the mass concentration of hydrogen fluoride and ammonium bifluoride in the activation solution are both 5%-40%;
a raw material for forming the activation solution, comprising: aqueous ammonia and hydrogen peroxide, wherein the activation solution comprises a mixed solution of aqueous ammonia and hydrogen peroxide in a volume ratio of (1:1)-(1:5); or
a raw material for forming the activation solution, comprising: sodium hypochlorite and aqueous ammonia, wherein the activation solution comprises a mixture of 5-20 wt % of sodium hypochlorite, 5-30 wt % of aqueous ammonia and 50-90 wt % of deionized water.

11. The glass composite according to claim 8, wherein:
the UV treatment comprises:
the surfaces of the first glass member and the second glass member are directly irradiated for 0.5-15 h with ultraviolet light; or
the surfaces of the first glass member and the second glass member are irradiated for 5-20 min with ultraviolet light in the presence of ozone; and
the plasma treatment comprises:
the surfaces of the first glass member and the second glass member are treated for 10-30 min by at least one of $O_2$ plasma and $N_2/H_2$ plasma.

12. The glass composite according to claim 6, wherein:
the water contact angle of the first activated surface or the second activated surface is equal to or less than 10 degrees;
the surface roughness of the first glass member and/or the second glass member is equal to or less than 0.2 µm; and
the activation treatment is conducted at a room temperature to 200° C.

13. The glass composite according to claim 6, wherein the first glass member and the second glass member are positioned in a vacuum environment in a period of time from the completion of the activation to the completion of the contact.

14. The glass composite according to claim 6, wherein the contacting between the first activated surface of the first glass member and the second activated surface of the second glass member is performed at a first predetermined temperature, and the first predetermined temperature does not exceed the softening points of the first glass member and the second glass member,
wherein the first predetermined temperature is 250-750° C.

15. The glass composite according to claim 6, wherein the contacting between the first activated surface of the first glass member and the second activated surface of the second glass member is performed under pressure,
wherein the pressure is 0.05-10 MPa.

16. A casing, wherein at least a part of the casing is formed by a glass composite, the glass composite comprises:
a first glass member and a second glass member, wherein:
the first glass member and the second glass member are at least partially connected with each other at a first activated surface of the first glass member and a second activated surface of the second glass member; and
the glass composite has a light transmittance not lower than 95% of the light transmittance of the one, with the lower light transmittance, of the first glass member and the second glass member, wherein:
the first activated surface is at least a part of a surface of the first glass member,
the second activated surface is at least a part of a surface of the second glass member,
the first activated surface and the second activated surface are in direct contact with each other without an interlayer, and the first glass member and the second glass member are bonded to each other by stable saturated chemical bonds formed by unsaturated chemical bonds on the first activated surface of the first glass member and unsaturated chemical bonds on the second activated surface of the second glass member.

17. The casing according to claim 16,
wherein the first glass member is a sheet glass member, and the second glass member is a frame-shaped glass member or a bar-shaped glass member,
wherein the lower surface of the frame-shaped glass member or the bar-shaped glass member is compounded onto the outer peripheral edge of the sheet glass member; or the lower surface of the frame-shaped glass member or the bar-shaped glass member is compounded onto the outer peripheral face of the sheet glass member.

18. The casing according to claim 17, wherein the inner surface and/or the outer surface where the sheet glass member and the frame-shaped glass member are connected is a flat surface, a curved surface, or a combination of a flat surface and a curved surface.

19. The casing according to claim 17, comprising:
at least one of: a position where the sheet glass member and the frame-shaped glass member are connected has an inner right-angled structure; a position where the sheet glass member and the frame-shaped glass member are connected has an internal step structure; an outer surface of the position where the sheet glass member and the frame-shaped glass member are connected is a curved surface; the frame-shaped glass member has an inner surface that is an outwardly bulged curved surface; the frame-shaped glass member has an inner surface that is an inclined surface that gradually tilts inwards; the frame-shaped glass member has an inner surface that is an inclined surface that gradually tilts outwards; or the frame-shaped glass member has an inner surface that is an inwardly bulged curved surface.

20. A display device, comprising:
a casing, wherein at least a part of the casing is formed by a glass composite, the glass composite comprises:
a first glass member and a second glass member, wherein:
the first glass member and the second glass member are at least partially connected with each other at a first activated surface of the first glass member and a second activated surface of the second glass member; and
the glass composite has a light transmittance not lower than 95% of the light transmittance of the one, with the lower light transmittance, of the first glass member and the second glass member, wherein:
the first activated surface is at least a part of a surface of the first glass member,
the second activated surface is at least a part of a surface of the second glass member,
the first activated surface and the second activated surface are in direct contact with each other without an interlayer, and
the first glass member and the second glass member are bonded to each other by stable saturated chemical bonds formed by unsaturated chemical bonds on the first activated surface of the first glass member and unsaturated chemical bonds on the second activated surface of the second glass member.

* * * * *